(12) United States Patent
Hsu

(10) Patent No.: US 6,804,695 B1
(45) Date of Patent: Oct. 12, 2004

(54) METHOD AND APPARATUS FOR CONSTRAINING TAP COEFFICIENTS IN AN ADAPTIVE FINITE IMPULSE RESPONSE FILTER

(75) Inventor: Yungping Hsu, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 626 days.

(21) Appl. No.: 09/717,240

(22) Filed: Nov. 22, 2000

(51) Int. Cl.$^7$ .............................................. G06F 17/10
(52) U.S. Cl. ....................................................... 708/322
(58) Field of Search .................................. 708/322–323

(56) References Cited

U.S. PATENT DOCUMENTS

| | | | |
|---|---|---|---|
| 5,220,466 A | | 6/1993 | Coker et al. .................. 330/46 |
| 5,381,359 A | | 1/1995 | Abbott et al. .......... 364/724.19 |
| 5,793,801 A | * | 8/1998 | Fertner ........................ 375/219 |
| 5,818,665 A | | 10/1998 | Satoh et al. ................... 360/65 |
| 5,892,632 A | * | 4/1999 | Behrens et al. ............... 360/51 |
| 5,917,862 A | | 6/1999 | Shimoda ..................... 375/341 |
| 5,966,415 A | * | 10/1999 | Bliss et al. .................. 375/350 |
| 5,999,355 A | | 12/1999 | Behrens et al. ............... 360/65 |
| 6,208,481 B1 | * | 3/2001 | Spurbeck et al. ............. 360/65 |
| 6,216,148 B1 | * | 4/2001 | Moran et al. ............... 708/322 |
| 6,222,879 B1 | * | 4/2001 | Cideciyan et al. .......... 708/323 |
| 2001/0002930 A1 | * | 6/2001 | Kates .......................... 381/317 |

OTHER PUBLICATIONS

Roy D. Cideciyan, et al., "A PRML System for Digital Magnetic Recording", IEEE Journal on Selected Areas in Communications, vol. 10, No. 1, Jan. 1992, pp. 38–56.
Wood, et al., "Viterbi Detection of Class IV Partial Response on a Magnetic Recording Channel", IEEE Transactions on Communications, vol. COM–34, No. 5, May 1986, pp. 454–461.
Coker, et al., "Implementation of PRML in a Rigid Disk Drive", IEEE Transactions on Magnetics, vol. 27, No. 6, Nov. 1991.
Bracken, et al., "Adaptive Continuous–Time Equalization Followed by FDTS/DF Sequence Detection", IEEE Transactions on Magnetics, vol. 31, No. 2, Mar. 1995, pp. 1089–1094.
Moon, et al., "Constrained–Complexity Equalizer Design for Fixed Delay Tree Search with Decision Feedback", IEEE Transactions on Magnetics, vol. 30, No. 5, Sep. 1994.
Abbott, et al., "Timing Recovery for Adaptive Decision Feedback Equalization of the Magnetic Storage Channel", GLOBECOM '90 IEEE Global Telecommunications Conference 1990, San Diego, California, Nov. 1990, pp. 1794–1799.
Abbott, et al., "Performance of Digital Magnetic Recording with Equalization and Offtrack Interference", IEEE Transactions on Magnetics, vol. 27, No. 1, Jan. 1991.
Cioffi, et al., "Adaptive Equalization in Magnetic–Disk Storage Channels", IEEE Communications Magazine, Feb. 1990, pp. 14–29.
Roger Wood, "Enhanced Decision Feedback Equalization", Intermag '90, p. EC–10.
Adaptive Algorithms and Structure, Chapter 6, undated.
Digital Communications, John G. Proakis, 3$^{rd}$ Edition, Chapter 11, undated.
Adaptive Signal Processing, Chapter 6, Bernard Widrow & Samuel D. Stearns, Prentice Hall, 1985.

* cited by examiner

*Primary Examiner*—Tan V. Mai

(57) ABSTRACT

Method and apparatus for constraining tap coefficients in an adaptive Finite Impulse Response filter includes structure and steps whereby a coefficient supply circuit provides at least two even tap coefficients and at least two odd tap coefficients to the adaptive Finite Impulse Response filter. Constraint circuitry then selectively constrains changes in the values of at least one of (i) the two even tap coefficients and (ii) the two odd tap coefficients. Preferably, the Finite Impulse Response filter has taps C0, C1, C2, C3, C4, C5, and C6. A coefficient supplier is coupled to provide coefficients to said taps, and an adaptive circuit changes the coefficients supplied by said coefficient supplier in accordance with changes in an output of the Finite Impulse Response filter. The adaptive circuit includes circuitry to constrain allowable change in both the even tap coefficients C0, C2, C4, C6 and in the odd tap coefficients C1, C3, C5.

140 Claims, 6 Drawing Sheets

METHOD AND APPARATUS FOR CONSTRAINING TAP COEFFICIENTS IN AN ADAPTIVE FINITE IMPULSE RESPONSE FILTER

BACKGROUND OF THE INVENTION

1. Field of the Invention

The present invention relates to method and apparatus for controlling Finite Impulse Response (FIR) filters typically used in hard disk storage systems for digital computers. In particular, present invention relates to method and apparatus for constraining the tap coefficients supplied to the FIR filter to minimize phase and gain discontinuity when switching between the acquisition and data reception periods.

2. Related Art

In the read channel of a hard disk drive, the read/write heed passes over the magnetic medium and outputs analog read pulses that alternate in polarity. These pulses are then decoded by read channel circuitry to reproduce the recorded digital data. Decoding the pulses into a digital sequence is typically performed by a discrete time sequence detector in a sampled amplitude read channel. There are several well-known discrete time sequence detection methods including discrete time pulse detection (DPD), partial response (PR) with Viterbi detection, maximum likelihood sequence detection (MLSD), decision-feedback equalization (DFE), enhanced decision-feedback equalization (EDFE), and fixed-delay tree-search with decision feedback (FDTS/DF).

Sampled amplitude detection, such as partial response (PR) with Viterbi detection, allows for increased data density by compensating for intersymbol interference (ISI) and the effect of channel noise. Unlike conventional peak detection systems, sampled amplitude recording detects digital data by interpreting, at discrete time instances, the actual value of the pulse data. To this end, the read channel comprises a sampling device for sampling the analog read signal, a timing recovery circuit for synchronizing the samples to the baud rate (code bit rate) Before sampling the pulses, a variable gain amplifier adjusts the read signal's amplitude to a nominal value, and a low pass analog filter filters the read signal to attenuate aliasing noise. After sampling, a digital equalizer filter equalizes the sample values according to a desired partial response, and a discrete time sequence detector, such an a Viterbi detector, interprets the equalized sample values in context to determine a most likely sequence for the digital data (i.e., maximum likelihood sequence detection (MLSD)). MLSD takes into account the effect of ISI and channel noise in the detection algorithm, thereby decreasing the probability of a detection error. This increases the effective signal to noise ratio and, for a given constraint, allows for significantly higher data density as compared to conventional analog peak detection read channels.

The application of sampled amplitude techniques to magnetic storage systems is well documented. See Roy D. Cideciyan, Francois Dolivo, Walter Hirt, and Wolfgang Schott, "A PRML System for Digital Magnetic Recording" IEEE Journal on Selected Areas in Communications, Vol. 10 No. 1, January 1992, pp.38–56; and Wood et al, "Viterbi Detection of Class IV Partial Response on a Magnetic Recording Channel", IEEE Trans. Commum., Vol. Com-34, No. 5, pp. 454–461, May 1986; and Coker Et al, "Implementation of PRML in a Rigid Disk Drive", IEEE Trans. On Magnetics, Vol. 27, No. 6, November 1991, and Carley et al, "Adaptive Continous-Time Equalization Followed By FDTS/DF Sequence Detection", Digest of The Magnetic Recording Conference, Aug. 15–17, 1994, pp. C3; and Moon et al, "Constrained-Complexity Equalizer Design for Fixed Delay Tree Search with Decision Feedback", IEEE Trans. on Magnetics, Vol. 30, No. 5, September 1994; and Abbott et al, "Timing Recovery For Adaptive Decision Feedback Equalization of The Magnetic Storage Channel", Globecom '90 IEEE Global Telecommunications Conference 1990, San Diego, Calif., November 1990, pp.1794–1799; a Abbott et al, "Performance of Digital Magnetic Recording with Equalization and Offtrack Interference", IEEE Transactions on Magnetics, Vol. 27, No. 1, January 1991; and Cioffi et al, "Adaptive Equalization in Magnetic-Disk Storage Channels", IEEE Communication Magazine, February 1990, and Roger Wood, "Enhanced Decision Feedback Equalization", Intermag '90, all of which are incorporated herein by reference.

Sampled amplitude detection requires timing recovery in order to correctly extract the digital sequence. Rather than process the continuous signal to align peaks to the center of bit cell periods as in peak detection systems, sampled amplitude systems synchronize the pulse samples to the baud rate. In conventional sampled amplitude read channels, timing recovery synchronizes a sampling clock by minimizing an error between the signal sample values and estimated sample values. A pulse detector or slicer determines the estimated sample values from the read signal samples. Even in the presence of ISI the sample values can be estimated and, together with the signal sample values, used to synchronize the sampling of the analog pulses in a decision-directed feedback system.

A phase-locked-loop (PLL) normally implements the timing recovery decision-directed feedback system. The PLL comprises a phase detector for generating a phase error based on the difference between the estimated samples and the read signal samples. A PLL loop filter filters the phase error, and the filtered phase error operates to synchronize the channel samples to the baud rate. Typically, the phase error adjusts the frequency of a sampling clock which is typically the output of a variable frequency oscillator (VFO). The output of the VFO controls a sampling device, such as an analog-to-digital (A/D) converter, to synchronize the sampling to the baud rate.

As mentioned above, sampled amplitude read channels also commonly employ a discrete time equalizer filer to equalize the sample values into a desired partial response (PR4, EPR4, EEPR4, etc.) before sequence detection. To this end, adaptive algorithms have been applied to compensate in real time for parameter variations in the recording system and across the disk radius. For example, U.S. Pat. No. 5,381,359 (incorporated herein by reference) discloses an adaptive equalizer filter that operates according to a well-known least mean square (LMS) algorithm. The LMS adaptive equalizer filter is a closed loop feedback system that attempts to minimize the mean squared error between an actual output of the filter and a desired output by continuously adjusting the filter's coefficients to achieve an optimum frequency response.

A problem associated with adaptive equalizer filters in sampled amplitude read channels is that the timing recovery and gain control loops can interfere with the adaptive feedback loop, thereby preventing the adaptive equalizer filter from converging to an optimal state. This non-convergence is manifested by the filter's phase and gain response drifting as it competes with the timing and gain control loops. An article by J. D. Coker et al. entitled "Implementation of PRML in Rigid Disk Drive", published in IEEE Transactions on Magnetics, vol. 27, No. 6, November 1991, suggests a three tap transversal filter comprising a fixed center tap and symmetric side taps in order to constrain the phase response of the equalizer filter except in terms of a fixed group delay. Constraining the phase response of the adaptive equalizer in this manner, however, is a very suboptimal method for attenuating interference from the timing recovery and gain control loops. Furthermore, it significantly reduces control over the adaptive filter's phase response, thereby placing the burden of phase compensation on the analog equalizer. Solutions to this problem have been proposed in U.S. Pat. Nos. 5,818,655 and 5,999,355, each of which is incorporated herein by reference. However, such solutions come at a high processing cost.

Another problem associated with adaptive equalizer filters is that the signal acquisition time is an overhead to the system throughput capacity. In order to reduce the acquisition time period, it is typical for the channel processor to switch from the FIR filter output to the filter input during the acquisition period. However, this switching can cause phase and gain discontinuity and effect the error rate performance of the real data field, which comes after each acquisition period.

Thus, there is a need for an improved method and apparatus for constraining the tap weight coefficients in an equalizer filter in order to minimize phase and gain discontinuity when switching between the acquisition and data reception periods.

SUMMARY OF THE INVENTION

It is am object of the present invention to overcome the drawbacks noted above a to provide method and apparatus for constraining equalizer tap weight coefficients which allows rapid and stable acquisition of digital data without undue phase and gain discontinuities.

According to one aspect of the present invention, method and apparatus for constraining tap coefficients in an adaptive Finite Impulse Response filter includes structure and steps whereby coefficient supply circuitry provides at least two even tap coefficients and at least two odd tap coefficients to the adaptive Finite Impulse Response filter. Constraint circuitry then selectively constrains changes in the values of at least one of (i) the two even tap coefficients and (ii) the two odd tap coefficients.

According to another aspect of the present invention, method and apparatus for constraining adaptation, coefficients in an equalizer includes structure and steps whereby sub-sampling circuitry is coupled to the equalizer to output sub-samples of equalizer output signals. Quantizing circuitry is coupled to the sub-sampling circuitry to output quantized, sub-sampled output signals. Constraining circuitry then constrains the adaptation coefficients of the equalizer by applying a constant orthogonal projection matrix to the quantized, sub-sampled output signals.

According to yet another aspect of the present invention, method and apparatus for am equalizer circuit includes structure and steps whereby an adaptive Finite Impulse Response filter hats taps C0, C1, C2, C3, C4, C5, and C6. A coefficient supplier is coupled to provide coefficients to said taps, and an adaptive circuit changes the coefficients supplied by said coefficient supplier in accordance with changes in air output of the Finite Impulse Response filter. The adaptive circuit includes circuitry to constrain allowable changes in both the even coefficients C0, C2, C4, C6 and in the odd coefficients C1, C3, C5.

According to a further aspect of the present invention, method and apparatus for a digital data read channel includes analog input circuitry receiving an analog input signal, the analog input circuitry including an analog-to-digital converter. Gain control circuitry, disposed to control a gain of the analog input circuitry, and timing control circuitry is disposed to control a timing of the analog-to-digital converter. Equalizer circuitry if coupled to the analog-to-digital converter and includes: (i), an adaptive Finite Impulse Response filter having, taps C0, C1, C2, C3, C4, C5, and C6; (ii) a coefficient supplier coupled to provide coefficients to said taps; and (iii) adaptive circuitry coupled to change the coefficient supplied by the coefficient supplier in accordance with changes in an output of the Finite Impulse Response filter, the adaptive circuitry including circuitry coupled to constrain allowable changes in both the even coefficients C0, C2, C4, C6 and in the odd coefficients C1, C3, C5. Finally, a decoder is coupled to an output of the equalizer circuitry.

According to another aspect of the present invention, a computer readable storage medium stores code which causes a processor to constrain tap coefficients in an adaptive Finite Impulse Response filter, the code causing the processor to perform the steps of: (a) supplying least two even tap coefficients and at least two odd tap coefficients to the adaptive Finite Impulse Response filter; and (b) selectively constraining changes in the values of at least one of (i) the two even tap coefficients and (ii) the two odd tap coefficients.

BRIEF DESCRIPTION OF THE DRAWINGS

The above and other aspects and advantages of the present invention will be better understood by the following detailed description of the presently preferred embodiment in conjunction with the drawings.

DETAILED DESCRIPTION OP THE PRESENTLY PREFERRED EXEMPLARY EMBODIMENT

1. Introduction

In magnetic read channel recording, fast timing and gain acquisition is important for the read process. This is because acquisition time is overhead to the capacity. In order to reduce the acquisition period, it is common for the channel processor to switch from the digital FIR filter output to the digital filter input during the acquisition period. However, certain filter tap weight constraints need to be maintained, otherwise this switching will cause phase and gain discontinuity and effect the error rate performance in the real data field, which comes after each acquisition period That is, if the tap weight coefficients are adjusted independently, the phase and gain may have discontinuities for the next read operation.

In such a read channel, the target signal at the digital FIR filter output in the acquisition period is a periodic signal. The target values in the presently preferred embodiment are +1, +1, −1, and −1 (normalized), and they repeat every 4 cycles. To provide the same target values at the, filter input, the digital FIR filter tap weights are preferably constrained as follows:

$C1-C3+C5$=constant (+1 or −1 normalized, preferably)

$C0-C2+C4-C6=0$ where $C0, \ldots, C6$ are the tap weights for tap0, ..., tap6, reactively. Other constraints are possible, as delimited by the claims.

Therefore, the FIR filter coefficient adaptation algorithm should maintain the above rules during the adaptation.

The present intention will now be described with respect to one or more dedicated CMOS integrated circuits used in the read channel of a computer hard disk drive. Of course, the invention is not limited to such an embodiment and may be used in any FIR or equalizer adaptation which receives digital signals. Moreover, such adaptations may be implemented in software running on a general or a special purpose computer. Therefore, the circuitry and functions to be described below may be embodied on a computer storage medium readable by a computer processor. The circuitry may also be embodied in one or more Digital Signal Processors, gate arrays, or other special purpose digital processors.

2. Read Channel Circuit

Figure 1:
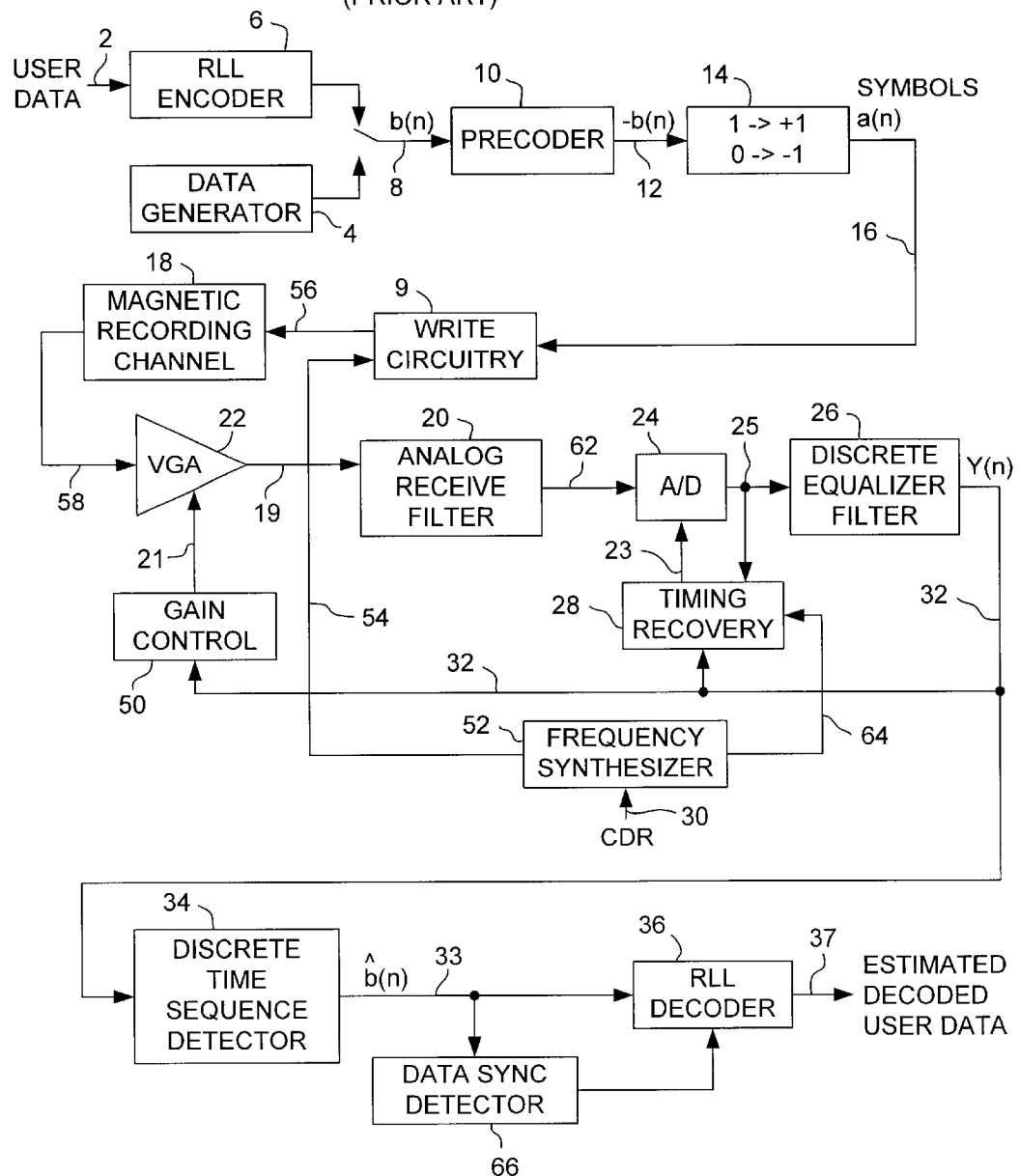
FIG. 1 is a block diagram of a sampled amplitude-recording channel.

FIG. 1 depicts the main components of a typical sampled amplitude read channel. During a write operation, either user data 2 or preamble data from a data generator 4 (for example 4T preamble data) is written onto the storage medium. An RLL encoder 6 encodes the user data 2 into a binary sequence b(n) 8 according to a predetermined RLL constraint. A precoder 10 precodes the binary sequence b(n) 8 in order to compensate for the transfer function of the recording channel 18 and equalizer filters to form a precoded sequence ~b(n) 12. The precoded sequence ~b(n) 12 is converted into symbols a(n) 16 by translating 14 ~b(N)=0 into a(N)=−1, and ~b (N)=1 into a(N)=+1. Write circuitry 9, responsive to the symbols a(n) 16, modulates the current in the recording head coil at the baud rate 1/T to record the binary sequence onto the storage medium. A frequency synthesizer 52 provides a baud rate write clock signal 54 to the write circuitry 9 and is adjusted by a channel data rate signal (CDR) 30 according to the zone the recording head is positioned over.

When reading the recorded binary sequence from the storage medium, timing recovery circuit 28 first locks to an acquisition preamble recorded on the disk prior to the recorded user data. A variable gain amplifier 22 adjusts the amplitude of the analog read signal 56, and an analog filter 20 provides initial equalization toward the desired response as well as attenuating aliasing noise. A sampling device 24 samples the analog read signal 62 from the analog filter 20, and a discrete time equalizer filter 26 provides further equalization of the sample values 25 toward the desired response.

The discrete equalizer filter 26 may be implemented am a real-time adaptive FIR filter which compensates for parameter variations over the disk radius (i.e., zones), disk angle, ad environmental conditions such as temperature drift and magnetic. The FIR filter output then becomes an input into an adaptive feedback loop and used to generate sample errors. The adaptive feedback loop conventionally employs a least mean square (LMS) algorithm to adapt the filter coefficients (i.e., it adapts the frequency and phase response of the filter) until a minimum mean squared error is achieved at the equalizer output.

After equalization, the equalized sample values 32 are applied to a decision directed main control circuit 50 and timing recovery 28 circuit for adjusting the amplitude of the read signal 58 and the frequency and phase of the sampling device 24, respectively. Timing recovery adjusts the frequency of sampling device 24 over line 23 in order to synchronize the equalized samples 32 to the baud rate. Frequency synthesizer 52 provides a center frequency setting to the timing recovery circuit 28 over line 64 in order to center the timing recovery frequency over temperature, voltage, and process variations. The channel data rate (CDR) 30 signal adjust a frequency range of the synthesizer 52 according to the data rate for the current zone. Gain control circuit 50 adjusts the gain of variable gain amplifier 22 over line 21 in order to match the magnitude of the channel's frequency response to the desired partial response.

The equalized samples Y(n) 32 are also sent to a discrete time sequence detector 34, such as a maximum likelihood (ML) Viterbi sequence detector, which detect an estimated binary sequence b(n) 33 from the sample values. An RLL decoder 36 decodes the estimated binary sequence b(n) 33 from the sequence detector 34 into estimated user data 37. A data sync detector 66 detects the sync mark 70 (shown in FIG. 2B) in the data sector 15 in order to frame operation of the RLL decoder 36. In the absence of errors, the estimated binary sequence b(n) 33 matches the recorded binary Sequence b(n) 8, and the decoded user data 37 matches the recorded user data 2.

3. Data Format

Figure 2A:
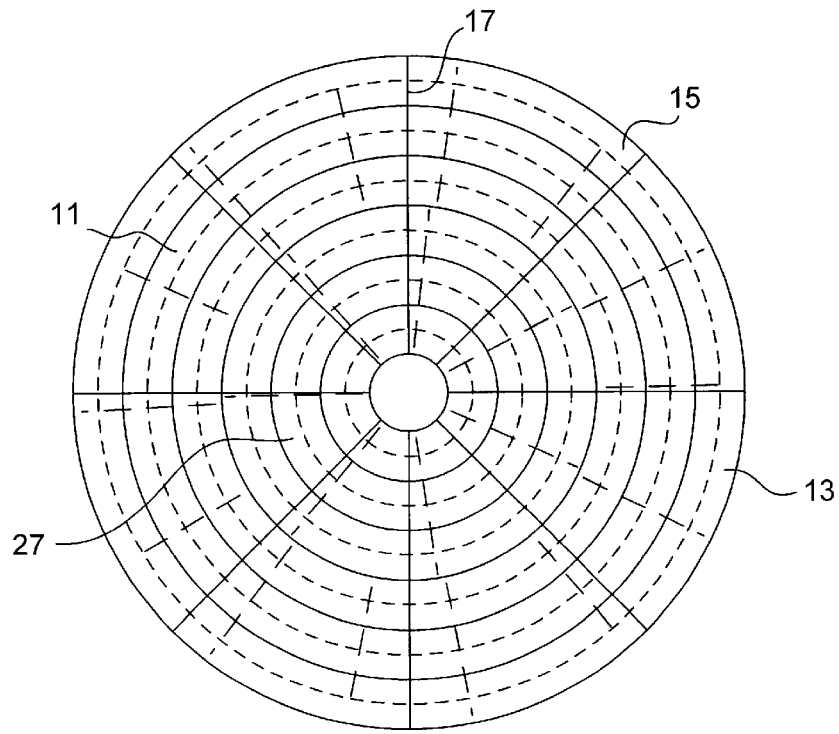
FIG. 2A depicts a magnetic disk comprising a plurality of concentric tracks having a plurality of user data sectors and embedded servo data sectors.

FIG. 2A shows an exemplary data format of a magnetic storage medium comprising a aeries of Concentric data tracks 13 wherein each data track 13 comprises a plurality of sectors 15 with embedded servo wedges 17. A servo controller (not shown) processes the servo data in the, servo wedges 17 and, in response thereto, positions the read/write head over a desired track. Additionally, the servo controller processes servo bursts within the servo wedges 17 to keep the head aligned over a centerline of the desired tract while writing and reading data. The servo wedges 17 may be detected by a simple discrete time pulse detector or by the discrete time sequence detector 34. IF the sequence detector 34 detects the servo data, then the format of the servo wedges 17 includes a preamble and a sync mark, similar to the user data sectors 15. To increase the overall storage density, the disk is partitioned into an outer zone 11 comprising fourteen data sectors per track, and an inner zone 27 comprising seven data sectors per track. In practice, the disk is actually partitioned into several zones with a different number of sectors in each zone, and the data recorded and detected at a different data rate in each zone.

Figure 2B:
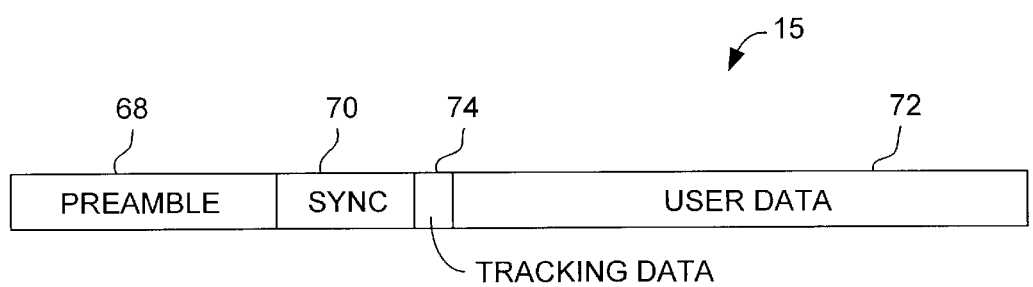
FIG. 2B depicts the data format of a user data sector.

FIG. 2B shows the format of a user data sector 15 comprising an acquisition preamble 6B, a sync mark 70, tracking data 74, and user data 72. Timing recovery uses the acquisition preamble 68 to acquire the correct sampling frequency and phase before reading the user data 72, ad the sync mark 70 demarks the beginning of the user data 72.

4. Preferred Circuitry

Figure 3:
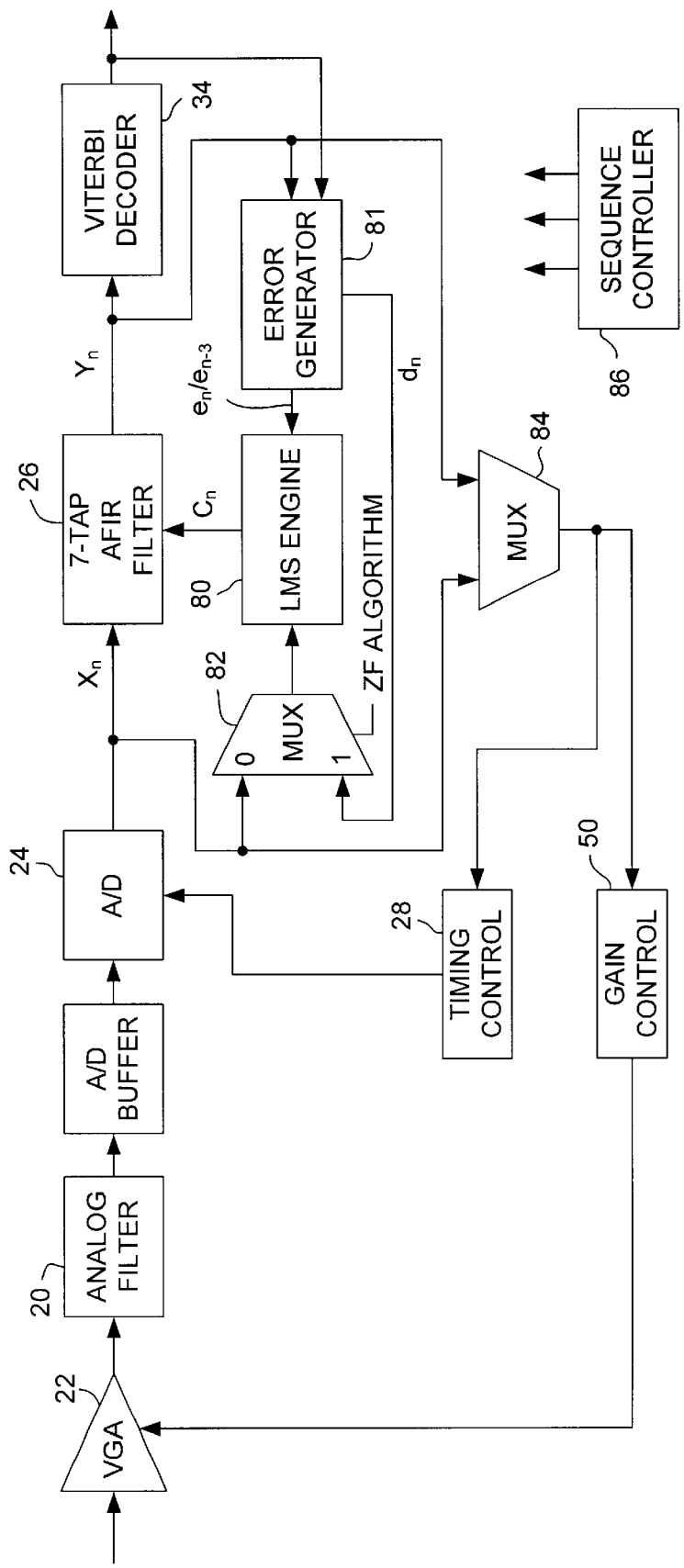
FIG. 3 is a block diagram of the presently preferred constraining circuitry.

FIG. 3 is a schematic diagram of a preferred embodiment of the present invention. In FIG. 3, the adaptive FIR filter 26 receives tap weight coefficients Cn from the LMS engine 80. The LMS engine 80 provides such coefficients based on the error En generated from the output of the filter 26, and based on the Xn input of the filter 26. The multiplexer 84 is controlled by a sequence controller 86 to perform the acquisition/data switching.

In more detail, the LMS engine 80 receives error data from an error generator 81 during tracking, and from the A/D converter 24 during acquisition. The input of this error generator 81 is the filter output Yn. The change in tap weight coefficients ΔCn is calculated to be $\Delta Cn = \mu^* Xn^* En$; where $\mu$ is the adaptation rate (to be discussed below) and E is the error output by the error generator 61. The pre-filtered data Xn and the post-filtered Yn are also supplied to a multiplexer 84 which provides these data to the timing control circuit 28 and the gain control circuit 50 for controlling, respectively, the A/D converter 24 timing and the VGA 22 gain.

As noted above, during the acquisition phase, the FIR filter tap weight coefficient does not change, but, after the acquisition phase, these tap weight coefficient changes are based on the output of the filter 26. In order to avoid phase and gain discontinuities, and to reduce latency in the A/D timing and gain feedback loops, the present invention constrains the values of the tap weight coefficients acquired during the data phase, thus coupling the FIR filter coefficient changes within constraints to be described in more detail below. The determination of the FIR tap weight coefficients can be initiated at each read gate or at some other periodic basis, as controlled by the sequence controller 86.

Figure 4:
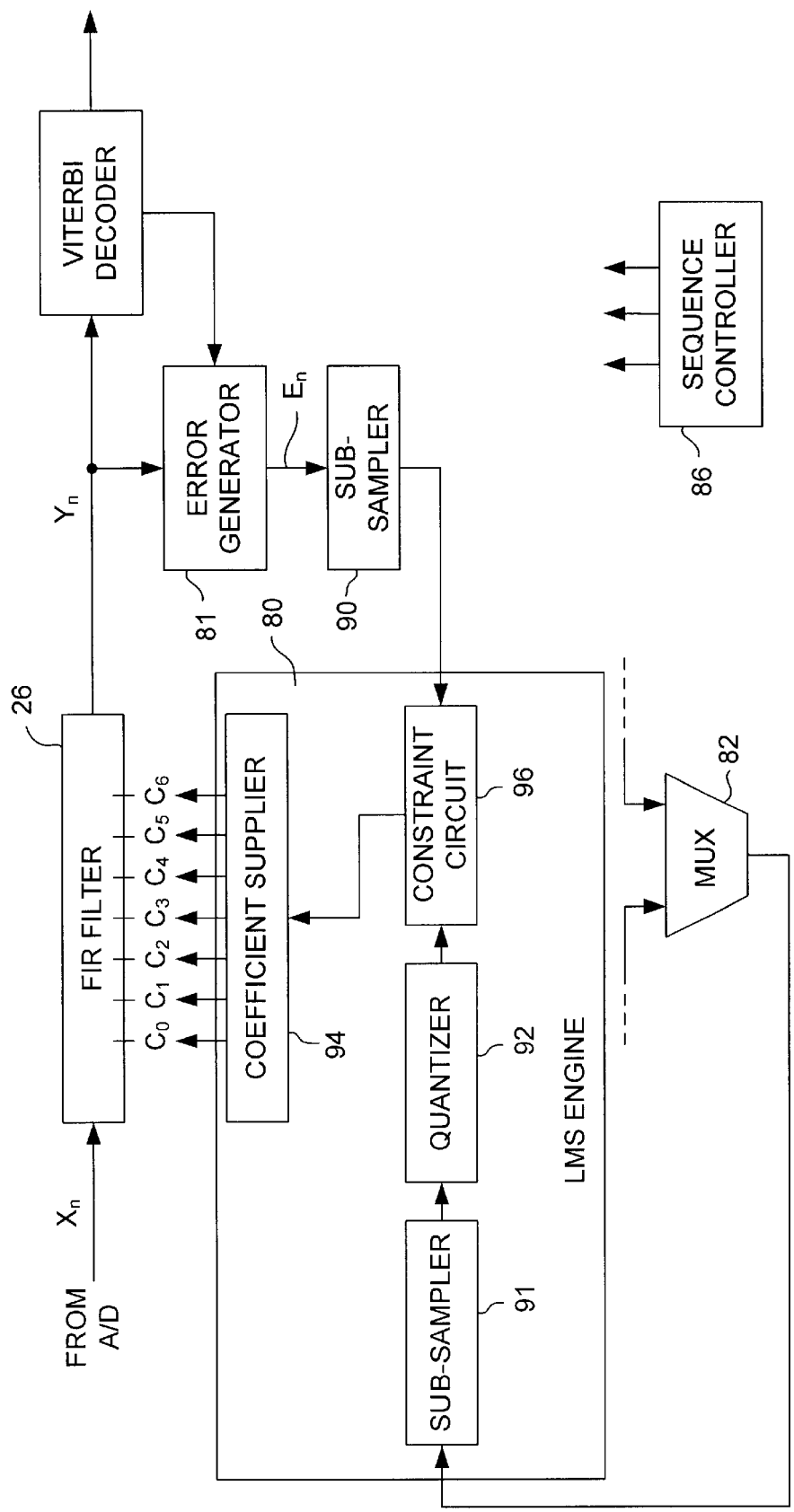
FIG. 4 is a block diagram showing the features of FIG. 3 in more detail.

In FIG. 4, the error generator output En is received by sub-sampling circuit 90 where it is sampled at, for example, every eight cycles, and the sampled output is supplied to the constraint circuit 96 in the LMS engine 80. Another sub-sampling circuit 91 (supplied by multiplexer 82) provides another sub-sampled input to the LMS engine 80 (or adaptation block). The sub-sampling circuit 91 provides its output to a quantizer circuit 92 for quantization, and the quantized output is supplied to constraint circuit 96 in the LMS engine 80. The constraint circuit 96 controls coefficient supplier 94 to provide the Cn's to the filter 26.

Figure 5A:
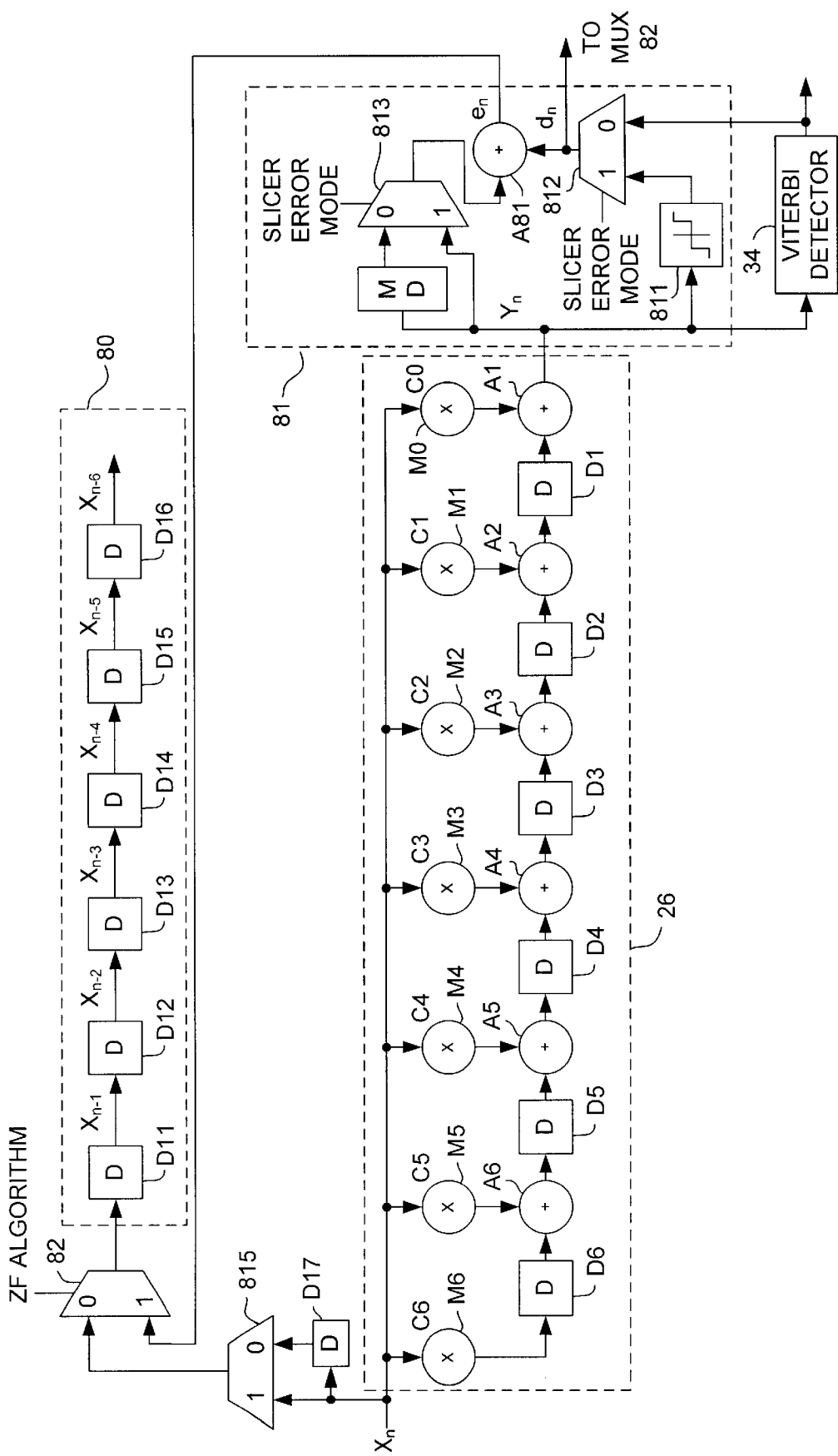
FIGS. 5A and 5B are, respectively, presently preferred, and alternative forms of an FIR filter arrangement according to the present invention.

FIG. 5A is a schematic diagram of a preferred embodiment of an FIR filter arrangement according to the present invention. Therein, data input Xn is supplied to both the multiplexer 815, and to the input of the FIR filter 26. The multiplexer 815 bas an Xn input and a delayed Xn input, as shown. The multiplexer 815 output is selected as 0 for the Viterbi detector, and 1 for the slicer 811 (to be described below). The selected output is supplied to multiplexer 82, along with the output En of the error generator 81. The multiplexer 82 selects either the En output or the selected Xn output (from multiplexer 815) based on a zero forcing algorithm.

In the FIR filter 26, the input data Xn is supplied to the multipliers M0–M6 where they are multiplied by coefficients C0–C6, respectively. After multiplication, the data are supplied to delays D1–D6 and adders A1–A6 as shown. The FIR output is supplied to the error generator 81, which may comprise a multiple delay MD1, a multiplexer 813 (to compensate for latency in the Viterbi detector 34), an adder A81, a multiplexer 812, and a slicer 811. The multiplexer 813 selects Yn or the delayed Yn according to the slicer error mode, where 1 is the slicer mode, and 0 is the Viterbi detector. The selected output Yn is provided to the adder A61. Likewise, the multiplexer 812 selects the output of the Viterbi detector 34 or the slicer 811 according to the slicer error mode, where 1 in the slicer mode, and 0 is the Viterbi detector. The selected outputs Dn is provided to the adder A81 where it is combined with the selected output Yn of the multiplexer 813 to generate the error En that is supplied to the LMS engine 80.

The mux 812 output Dn is also supplied to the mux 82, which selects either Dn or the data input Xn according to a zero-forcing algorithm to be described below. The output of mux 82, then, is Supplied to LMS engine 80, which may comprise delays D11–D16, as shown.

As will be explained in more detail below, in FIG. 5A. The zero-forcing applied to mux 82 may be as follows:

$$\Delta C0 = \mu^* En-3^* Dn$$

$$\Delta C1 = \mu^* En-3^* Dn-1$$

$$\Delta C2 = \mu^* En-3^* Dn-2$$

$$\Delta C3 = \mu^* En-3^* Dn-3$$

$$\Delta C4 = \mu^* En-3^* Dn-4$$

$$\Delta C5 = \mu^* En-3^* Dn-5$$

$$\Delta C6 = \mu^* En-3^* Dn-6.$$

Figure 5B:
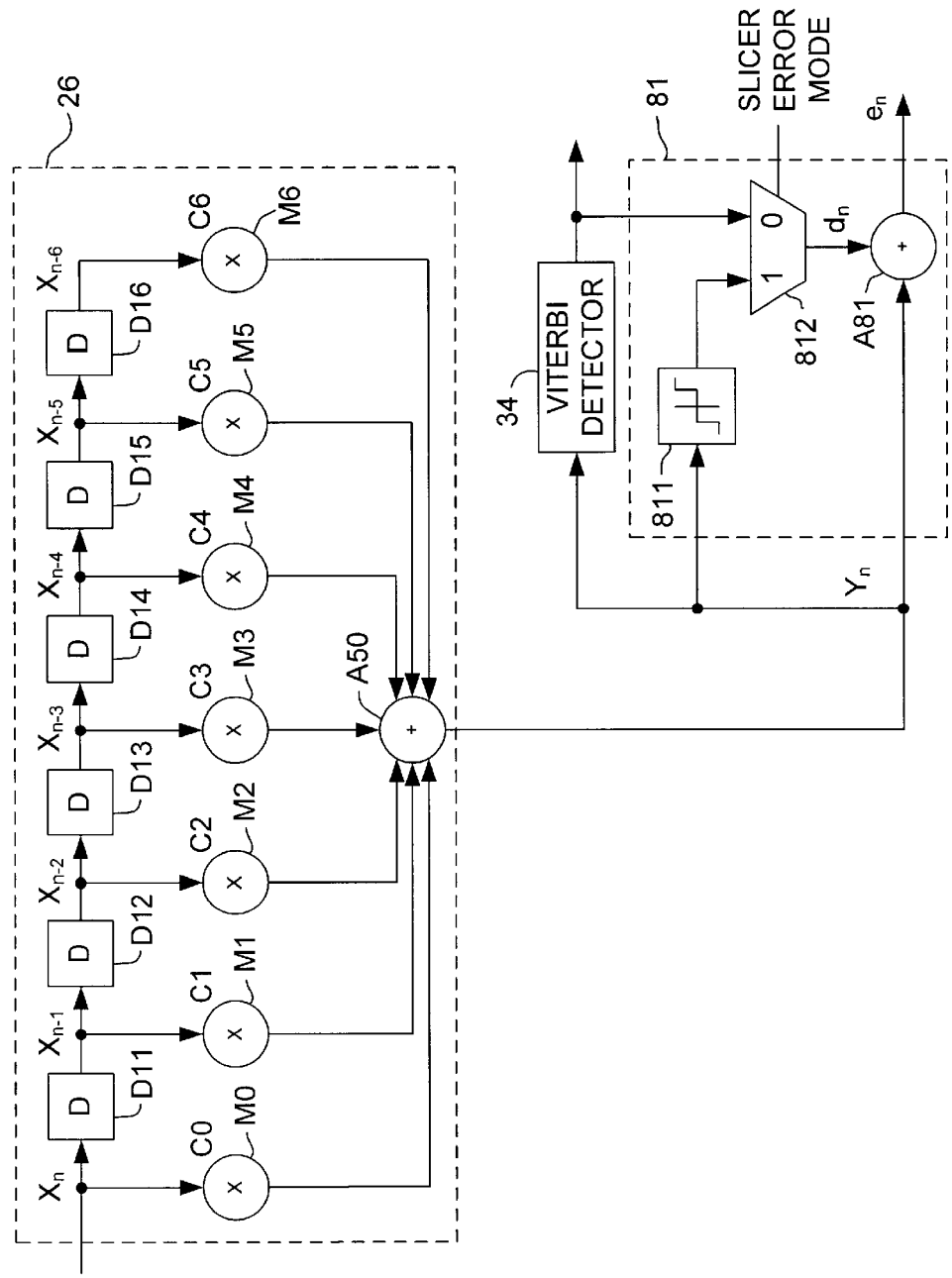

FIG. 5B is a schematic diagram of an alternative embodiment of the FIR filter arrangement, wherein structure the same as FIG. 5A is represented by the same reference numerals. In FIG. 5B, the data input Xn is supplied to the delays D11–D16, and the delayed outputs are supplied to multipliers M0–M6 where they are multiplied by coefficients C0–C6, as shown. These delayed and multiplied outputs are provided to a single adder A50, and the added output is supplied to the error generator 81, which operates in a manner similar to that described above with reference to FIG. 5A.

As is explained in more detail below, in FIGS. 5A and 5B, the LMS engine produces changes in the coefficients Cn, as follows:

$$\Delta C0 = \mu^* En^*(Xn)$$

$$\Delta C1 = \mu^* En^*(Xn-1)$$

$$\Delta C2 = \mu^* En^*(Xn-2)$$

$$\Delta C3 = \mu^* En^*(Xn-3)$$

$$\Delta C4 = \mu^* En^*(Xn-4)$$

$$\Delta C5 = \mu^* En^*(Xn-5)$$

$$\Delta C6 = \mu^* En^*(Xn-6).$$

5. Operation

The presently preferred embodiment operates in the following manner during the data phase. The A/D 24 output samples may be depicted as:

```
Xn ------------------------------------------------------------------┐
       D        D        D        D        D        D                │
                                                                      │
                                                                      │
                                                                      │
Xn-6 ◄---- Xn-5 ◄---- Xn-4 ◄---- Xn-3 ◄---- Xn-2 ◄---- Xn-1 ◄---- Xn ◄-┘
``` even taps:

C6                C4                C2                C0 odd taps:

C5                C3                C1

The FIR output is then: $Y = C6*Xn-6 + C5*Xn-5 + C4*Xn-4 + C3*Xn-3 + C2*Xn-2 + C1*Xn-1 + C0*Xn$.

The equalization error is: $En = dn - yn$ where dn is the desired equalizer output generated from threshold detector or Viterbi detector ($dn = +1, 0,$ or $-1$, normalized).

The preferred constraints are:

$C1 - C3 + C5 =$ constant (normalized to $\pm 1$)

$C0 - C2 + C4 - C6 = 0$

Therefore, the objective is to change the coefficients C as follows:

$\Delta C1 - \Delta C3 + \Delta C5 = 0$ $\Delta C0 - \Delta C2 + \Delta C4 - \Delta C6 = 0$ The general Least Mean square algorithm is:

$\Delta(\text{coeff}) = \mu * \text{error} * \text{input}$

To reduce implementation complexity, the preferred embodiment uses a "signed-data LMS algorithm" as follows:

$\Delta C0 = \mu * En * \text{sign}(Xn)$ $\Delta C1 = \mu * En * \text{sign}(Xn-1)$ $\Delta C2 = \mu * En * \text{sign}(Xn-2)$ $\Delta C3 = \mu * En * \text{sign}(Xn-3)$ $\Delta C4 = \mu * En * \text{sign}(Xn-4)$ $\Delta C5 = \mu * En * \text{sign}(Xn-5)$ $\Delta C6 = \mu * En * \text{sign}(Xn-6)$ where the signals the plus or minus sign of the data Xn.

A general Zero Forcing algorithm may be used:

$\Delta(\text{coeff}) = \mu * \text{error} * FIR \text{ input target } (Xhat)$ where the FIR input target that is the noiseless FIR filter input. When $\Sigma(Xnhat) < 1$ See, Chapter 11, "Adaptive Equalization", in DIGITAL COMMUNICATIONS, John G. Proakis, McGraw-Hill, Inc., 1993, incorporated herein by reference) then (Xnhat) can be replaced by dn, the ideal equalizer target. In the preferred architecture, it is generated from the slicer output or is regenerated from the Viterbi output. In either case, possible values are $(-1, 0, 1)$. To compensate for the group delay from Xnhat to dn the En is delayed accordingly. The amount of the delay is equal to the group delay in the FIR filter. In this case, the delay is 3 clock cycles because the tap weights are symmetric about tap 3.

In the preferred embodiment a signed-data zero forcing algorithm is used as follows:

$\Delta C0 = \mu * En-3 * \text{sign}(dn)$ $\Delta C1 = \mu * En-3 * \text{sign}(dn-1)$ $\Delta C2 = \mu * En-3 * \text{sign}(dn-2)$ $\Delta C3 = \mu * En-3 * \text{sign}(dn-3)$ $\Delta C4 = \mu * En-3 * \text{sign}(dn-4)$ $\Delta C5 = \mu * En-3 * \text{sign}(dn-5)$ $\Delta C6 = \mu * En-3 * \text{sign}(dn-6)$

6. Adaptation Scheme

In the preferred embodiment, even and odd tap coefficient adaptation during the data phase can be independently enabled/disabled. This can be done by hard-wiring all the different modes (to be described below) into the integrated circuit and allowing the end user to modify the circuit for his/her particular use. Alternatively, the sequence controller 86 can include circuitry to allow selecting or switching between and among the various modes. Also, where the adaptive filtering is performed in software, selecting software can be provided to allow the end user to select those modes which provide the shortest and most stable data acquisition. It is preferred that the adaptation be carried out every 8 samples during the data phase to reduce the hardware requirement.

In the preferred embodiment, the user can select one or more of the following modes: (A) even tap coefficient adaptation can be selected to be one of a so-called "(2,4;0,6) mode", a "(2,4) mode", or a "(0,2,4,6) mode"; and (B) odd tap coefficient adaptation can be selected to be one of a "(1,3,5) mode", or a "(1,5) mode".

In the preferred embodiment, he adaptation rate '$\mu$' is:

1/256, if PSCL [1:0]==2'b00

1/128, if PSCL [1:0]==2'b01

1/64, if PSCL [1:0]==2'b10

(normally PSCL (Post Scaling)=2'b01)
(A) Even Tap Modes:
(i) In the (2,4; 0,6) mode:, C2 and C4 are coupled (that is, they adapt by the same amount), and C0 and C6 are coupled:

$\Delta C0 = \Delta C6 = \mu * En * \text{sign}((Xn)+(Xn-6))$ (C0 and C2 are coupled)

$\Delta C2 = \Delta C4 = \mu * En * \text{sign}((Xn-2)+(Xn-4))$ (C2 and C4 are coupled)
(ii) In the (2,4) mode, only (C2, C4) adapt:

$\Delta C2 = \Delta C4 = \mu * En * \text{sign}((Xn-2)+(Xn-4))$ (C2 ad C4 are coupled)
where $\mu$ is as defined in (2, 4; 0, 6) mode.
(iii) In the (0,2,4,6) mode, all four even tap coefficients are coupled:

if (sign(C0)−sign(C2)+sign(C4)−sign(C6)=0, $\Delta C0 = \mu * en * \text{sign}(Xn)$ $\Delta C2 = \mu * en * \text{sign}(Xn-2)$ $\Delta C4 = \mu * en * \text{sign}(Xn-4)$ $\Delta C6 = \mu * en * \text{sign}(Xn-6)$.

else if sign(C2)=sign(C4)) and sign (C0)≠sign (C6), $\Delta C2 = \Delta C4 = \mu * en\ \text{sign}((Xn-2)+(Xn-4))$ $\Delta C0 = \Delta C6 = 0$.

else if sign (C0)=sign(C6), $\Delta C0 = \Delta C6 = \mu * en\ \text{sign}((Xn)+(Xn-6))$ $\Delta C2 = \Delta C4 = 0$.

(B) Odd tap modes:
(i) In the (1,3,5) mode, C1, C3, and C5 are coupled:
first quantize {(Xn−1), (Xn−3), (Xn−5)} into {(Xn−1), q, (Xn−3), q, (Xn−5), q}
with values of −1, 0 or +1 represented by 2 bits {2'b11, 2'b00, 2'b01}

$q = +1, \text{ if } \frac{1}{2} \leq X$ $= 0, \text{ if } -\frac{1}{2} \leq X < \frac{1}{2}$ $= -1, \text{ if } X \leq -\frac{1}{2}$ second, perform the following matrix operation:

$$\begin{vmatrix} \Delta C1 \\ \Delta C3 \\ \Delta C5 \end{vmatrix} = \begin{vmatrix} 2 & 1 & -1 \\ 1 & 2 & 1 \\ -1 & 1 & 2 \end{vmatrix} * \begin{vmatrix} (Xn-1), q \\ (Xn-3), q \\ (Xn-5), q \end{vmatrix} \pm \mu * En$$

where the 3*3 matrix is a projection matrix into a subspace of rank 2 which is orthogonal to [1 −1 1] (the constraint vector for the odd tapweights). It has eigen-values of 3, 3, and 0.

The (1,3,5) adaptation will be frozen temporarily for the current adaptation cycle if the center tap C3 saturates.

(ii) In the (1,5) mode, C1 and C5 are coupled:

(C1, C5) adapt when sign(Xn−1)=−sign(Xn−5), freezes otherwise, and C3 is held constant.

$\Delta C1 = \mu * En * \text{sign}(Xn-1)$ $\Delta C5 = \mu * En * \text{sign}(Xn-5)$.

Note that one or more of the odd tap modes may be selected while the even taps are allowed to adjust independently. Conversely, one or more of the even tap modes may be selected while the odd taps are allowed to adjust independently. Also, a mix of one or more of the odd tap modes ad one or more of the even tap modes may be selected.

(B) Viterbi-based Adaptation

Under this mode, the Yn is delayed 1 clock cycle. The error signal is generated from the difference between early Viterbi output (PR4 or NPV programmable) and delayed FIR output. This is another way of generating the error and the FIR target din rather than using the slicer. The Xn should be delayed accordingly in order to match the latency in the error signal En.

(C) Coefficient Initialization

The 7 coefficients can be initialized from register values or previously adapted values. When adaptation is disabled, register values will be used. Thus, the FIR output is sliced the error is calculated.

7. Conclusion

Thus, what has been described is method and apparatus for constraining the tap weight coefficients in an equalizer (such as an FIR filter) so as to eliminate phase and gain discontinuities to allow faster and stable acquisition/data switching.

The individual components shown in outline or designated by blocks in the attached Drawings are all well-known in the FIR filtering arts, and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of tho following claims is to be accorded the broadest interpretation so as to encompass all such modifications and equivalent structures and functions.

What is claimed is:

1. Apparatus for constraining tap coefficients in an adaptive Finite Impulse Response filter, comprising:
coefficient supply circuitry disposed to provide at least two even tap coefficients and at least two odd tap coefficients to the adaptive Finite Impulse Response filter,
wherein the at least two even tap coefficients are grouped into a plurality of groups of even tap coefficients and the at least two odd tap coefficients are grouped into a plurality of groups of odd tap coefficients; and
constraint circuitry which selectively constrains changes in the values of at least one of (i) even tap coefficients in at least one of the plurality of groups of even tap coefficients and (ii) odd tap coefficients in at least one of the plurality of groups of odd tap coefficients,
wherein a change in value of tap coefficients in a group of tap coefficients is independent of changes in values of tap coefficients in other groups of tap coefficients.

2. Apparatus according to claim 1, wherein said constraint circuitry constrains the odd tap coefficients by orthogonal projection.

3. Apparatus according to claim 1, wherein said constraint circuitry constrains the even tap coefficients such that $C0-C2+C4-C6=0$.

4. Apparatus according to claim 1, wherein said constraint circuitry constrains the odd tap coefficients such that $C1-C3+C5=$ a constant.

5. Apparatus according to claim 4, wherein said constraint circuitry constrains $C1$, $C3$, and $C5$ by application of a constant orthogonal projection matrix.

6. Apparatus for constraining tap coefficients in an adaptive Finite Impulse Response filter, comprising:
coefficient supply circuitry disposed to provide at least two even tap coefficients and at least two odd tap coefficients to the adaptive Finite Impulse Response filter; and
constraint circuitry which selectively constrains changes in the values of at least one of the two even tap coefficients and (ii) the two odd tap coefficients,
wherein said constraint circuitry constrains the odd tap coefficients by orthogonal projection; and
sub-sampling circuitry disposed to provide to said constraint circuitry sub-samples of an adaptive Finite Impulse Response filter output signal.

7. Apparatus according to claim 6, further comprising quantization circuitry disposed to quantize the sub-samples of the adaptive Finite Impulse Response filter output signal prior to orthogonal projection.

8. Apparatus for constraining tap coefficients in an adaptive Finite Impulse Response filter, comprising:
coefficient supply circuitry disposed to provide at least two even tap coefficients and at least two odd tap coefficients to the adaptive Finite Impulse Response filter; and
constraint circuitry which selectively constrains changes in the values of at least one of (i) the two even tap coefficients and (ii) the two odd tap coefficients,
wherein said constraint circuitry constrains the even tap coefficients such that $C0-C2+C4-C6=0$,
wherein said constraint circuitry constrains the even tap coefficients such that $C2$ and $C4$ are coupled.

9. Apparatus for constraining tap coefficients in an adaptive Finite Impulse Response filter, comprising:
coefficient supply circuitry disposed to provide at least two even tap coefficients and at least two odd tap coefficients to the adaptive Finite Impulse Response filter; and
constraint circuitry which selectively constrains changes in the values of at least one of (i) the two even tap coefficients and (ii) the two odd tap coefficients.
wherein said constraint circuitry constrains the even tap coefficients such that $C0-C2+C4-C6=0$,
wherein said constraint circuitry constrains the even tap coefficient such that $C2$ and $C4$ are coupled, and such that $C0$ and $C6$ are coupled.

10. Apparatus for constraining tap coefficients in an adaptive Finite Impulse Response filter, comprising:
coefficient supply circuitry disposed to provide at least two even tap coefficients and at least two odd tap coefficients to the adaptive Finite Impulse Response filter; and
constraint circuitry which selectively constrains changes in the values of at least one of (i) the two even tap coefficients and (ii) the two odd tap coefficients,
wherein said constraint circuitry constrains the even tap coefficients such that $C0-C2+C4-C6=0$,
wherein said constraint circuitry constrains the even tap coefficient such that $C0$, $C2$, $C4$, and $C6$ are coupled.

11. Apparatus for constraining tap coefficients in an adaptive Finite Impulse Response filter, comprising:
coefficient supply circuitry disposed to provide at least two even tap coefficients and at least two odd tap coefficients to the adaptive Finite Impulse Response filter; and
constraint circuitry which selectively constrains changes in the values of at least one of (i) the two even tap coefficients and (ii) the two odd tap coefficients,
wherein said constraint circuitry constrains the odd tap coefficients such that $C1-C3+C5=$ a constant,
wherein said constraint circuitry constrains the odd tap coefficients such that $C1$ and $C5$ are coupled.

12. Apparatus for constraining tap coefficients in an adaptive Finite Impulse Response filter, comprising:
coefficient supply circuitry disposed to provide at least two even tap coefficients and at least two odd tap coefficients to the adaptive Finite Impulse Response filter; and
constraint circuitry which selectively constrains changes in the values of at least one of (i) the two even tap coefficients and (ii) the two odd tap coefficients,
wherein said constraint circuitry constrains the even tap coefficients but not the odd tap coefficients.

13. Apparatus for constraining tap coefficients in an adaptive Finite Impulse Response filter, comprising:
coefficient supply circuits disposed to provide at least two even tap coefficients and at least two odd tap coefficients to the adaptive Finite Impulse Response filter, and
constraint circuitry which selectively constrains chances in the values of at least one of (i) the two even tap coefficients and (ii) the two odd tap coefficients,
wherein said constraint circuitry constrains the odd tap coefficients but not the even tap coefficients.

14. Apparatus for constraining adaptation coefficients in an equalizer, comprising:
sub-sampling circuitry coupled to the equalizer to output sub-samples of equalizer output signals;
quantizing circuitry coupled to said sub-sampling circuitry to output quantized, sub-sampled output signal; and constraining circuitry disposed to constrain the adaptation coefficients of the equalizer by applying a constant orthogonal projection matrix to the quantized, sub-sampled output signals.

15. Apparatus according to claim 14, wherein said constraining circuitry constrains odd tap coefficients using said constant orthogonal projection matrix.

16. Apparatus according to claim 14, wherein said constraining circuitry constrains odd tap coefficients such that C1−C3+C5=a constant.

17. Apparatus according to claim 16, wherein said constraining circuitry constrains odd tap coefficients such that C1, C3, and C5 are coupled.

18. Apparatus according to claim 16, wherein said constraining circuitry constrains odd tap coefficients such that C1 and C5 are coupled.

19. Apparatus according to claim 14, further comprising selecting circuitry coupled to select among the following odd tap constraint modes:
where C1, C3, and C5 are coupled; and
where C1 and C5 are coupled.

20. Apparatus according to claim 14, wherein said constraining circuitry constraints even tap coefficients such that C0−C2+C4−C6=0.

21. Apparatus according to claim 20, wherein said constraining circuitry constrains even tap coefficients such that C2 and C4 are coupled.

22. Apparatus according to claim 20, wherein said constraining circuitry constrains even tap coefficients such that C2 and C4 are coupled, and such that C0 and C6 are coupled.

23. Apparatus according to claim 20, wherein said constraining circuitry constrains even tap coefficients such, that C0, C2, C4, and C6 are coupled.

24. Apparatus according to claim 14, further comprising selecting circuitry disposed to select among the following even tap constraint modes:
where C2 and C4 are coupled;
where C2 and C4 are coupled, and where C0 and C6 are coupled; and where C0, C2, C4, and C6 are coupled.

25. Apparatus according to claim 14, further comprising selecting circuitry disposed to select among the following constraint modes:
where C1, C3, and C5 are coupled;
where C1 and C5 are coupled;
where C2 and C4 are coupled;
where C2, C4 are coupled and where C0 and C6 are coupled; and
where C0, C2, C4, and C6 are coupled.

26. Equalizer circuitry comprising:
an adaptive Finite Impulse Response filter having taps C0, C1, C2, C3, C4, C5, and C6;
a coefficient supplier coupled to provide coefficients to said taps,
wherein even tap coefficients are grouped into a plurality of groups of even tap coefficients and odd tap coefficients are grouped into a plurality of groups of odd tap coefficients; and
adaptive circuitry coupled to change the coefficients supplied by said coefficient supplier in accordance with changes in an output of the Finite Impulse Response filter, said adaptive circuitry including circuitry coupled to constrain allowable changes in both the even tap coefficients C0, C2, C4, C6 in at least one of the plurality of groups of even tap coefficients and in the odd tap coefficients C1, C3, C5 in at least one of the plurality of groups of odd tap coefficients,
wherein a change in value of tap coefficients in a group of tap coefficients is independent of changes in values of tap coefficients in other groups of tap coefficients.

27. Circuitry according to claim 26, wherein said adaptive circuitry constrains the even tap coefficients such that C0−C2+C4−C6=0.

28. Apparatus according to claim 26, wherein said adaptive circuitry constrains C1, C3, and C5 by application of a constant orthogonal projection matrix.

29. Equalizer circuitry comprising:
an adaptive Finite Impulse Response filter having taps C0, C1, C2, C3, C4, C5, and
a coefficient supplier coupled to provide coefficients to said taps, and
adaptive circuitry coupled to change the coefficients supplied by said coefficient supplier in accordance with changes in an output of the Finite Impulse Response filter, said adaptive circuitry including circuitry coupled to constrain allowable changes in both the even tap coefficients C0, C2, C4, C6 and in the odd tap coefficients C1, C3, C5,
wherein said adaptive circuitry constrains the even coefficients such that C2 and C4 change by substantially the same amount.

30. Circuitry according to claim 29, wherein said adaptive circuitry constrains the even coefficients such that C0 and C6 change by substantially the same amount.

31. Equalizer circuitry comprising:
an adaptive Finite Impulse Response filter having taps C0, C1, C2, C3, C4, C5, and C6,
a coefficient supplier coupled to provide coefficients to said taps, and
adaptive circuitry coupled to change the coefficients supplied by said coefficient supplier in accordance with changes in an output of the Finite Impulse Response filter, said adaptive circuitry including circuitry coupled to constrain allowable changes in both the even tap coefficients C0, C2, C4, C6 and in the odd tap coefficients C1, C3, C5,
wherein said adaptive circuitry constrains the odd tap coefficients such that C1 and C5 are coupled.

32. Equalizer circuitry comprising:
an adaptive Finite Impulse Response filter having taps C0, C1, C2, C3, C4, C5, and C6;
a coefficient supplier coupled to provide coefficients to said taps, and
adaptive circuitry coupled to change the coefficients supplied by said coefficient supplier in accordance with changes in an output of the Finite Impulse Response filter, said adaptive circuitry including circuitry coupled to constrain allowable changes in both the even tap coefficients C0, C2, C4, C6 and in the odd tap coefficients C1, C3, C5,
wherein said adaptive circuitry constrains the even tap coefficients but not the odd tap coefficients.

33. Equalizer circuitry comprising:
an adaptive Finite Impulse Response filter having taps C0, C1, C2, C3, C4, C5, and C6;
a coefficient supplier coupled to provide coefficients to said taps, and
adaptive circuitry coupled to change the coefficients supplied by said coefficient supplier in accordance with changes in an output of the Finite Impulse Response filter, said adaptive circuitry including circuitry coupled to constrain allowable changes in both the even tap coefficients C0, C2, C4, C6 and in the odd tap coefficients C1, C3, C5, wherein said adaptive circuitry constrains the odd tap coefficients but not the even tap coefficients.

34. Apparatus for constraining tap coefficients in an adaptive Finite Impulse Response filter, comprising;

coefficient supply means for providing at least two even tap coefficients and at least two odd tap coefficients to the adaptive Finite Impulse Response filter, wherein the at least two even tap coefficients are grouped into a plurality of groups of even tap coefficients and the at least two odd tap coefficients are grouped into a plurality of groups of odd tap coefficients; and constraint means for selectively constraining changes in the values of at least one of (i) even tap coefficients in at least one of the plurality of groups of even tap coefficients and (ii) odd tap coefficients in at least one of the plurality of groups of odd tap coefficients, p2 wherein a change in value of tap coefficients in a group of tap coefficients is independent of changes in values of tap coefficients in other groups of tap coefficients.

35. Apparatus according to claim 34, wherein said constraint means constrains the odd tap coefficients by orthogonal projection.

36. Apparatus according to claim 34, wherein said constraint means constrains the even tap coefficients such that C0−C2+C4−C6=0.

37. Apparatus for constraining tap coefficients in an adaptive Finite Impulse Response filter, comprising;

coefficient supply means for providing at least two even tap coefficients and at least two odd tap coefficients to the adaptive Finite Impulse Response filter; and constraint means for selectively constraining changes in the values of at least one of (i) the two even tap coefficients and (ii) the two odd tap coefficients, wherein said constraint means constrains the odd tap coefficients by orthogonal projection; and sub-sampling means for providing to said constraint circuitry sub-samples of an adaptive Finite Impulse Response filter output signal.

38. Apparatus according to claim 37, further comprising quantization means for quantizing the sub-samples of the adaptive Finite Impulse Response filter output signal prior to orthogonal projection.

39. Apparatus for constraining tap coefficients in an adaptive Finite Impulse Response filter, comprising, coefficient supply means for providing at least two even tap coefficients and at least two odd tap coefficients to the adaptive Finite Impulse Response filter; and constraint means for selectively constraining changes in the values of at least one of (i) the two even tap coefficients and (ii) the two odd tap coefficients, wherein said constraint means constrains the even tap coefficients such that C0−C2+C4−C6=0, wherein said constraint means constrains the even tap coefficients such that C2 and C4 are coupled.

40. Apparatus according to claim 34, wherein said constraint means constrains the odd tap coefficients such that C1−C3+C5=a constant.

41. Apparatus according to claim 40, wherein said constraint means constrains C1, C3, and C5 by application of a constant orthogonal projection matrix.

42. Apparatus for constraining tap coefficients in an adaptive Finite Impulse Response filter, comprising;

coefficient supply means for providing at least two even tap coefficients and at least two odd tap coefficients to the adaptive Finite Impulse Response filter; and constraint means for selectively constraining changes in the values of at least one of (i) the two even tap coefficients and (ii) the two odd tap coefficients, wherein said constraint means constrains the even tap coefficients such that C0−C2+C4−C6=0, wherein said constraint means constrains the even tap coefficients such that C2 and C4 are coupled, and such C0 and C6 are coupled.

43. Apparatus for constraining tap coefficients in an adaptive Finite Impulse Response filter, comprising:

coefficient supply means for providing at least two even tap coefficients and at least two odd tap coefficients to the adaptive Finite Impulse Response filter; and constraint means for selectively constraining changes in the values of at least one of (i) the two even tap coefficients and (ii) the two odd tap coefficients, wherein said constraint means constrains the even tap coefficients such that C0−C2+C4−C6=0, wherein said constraint means constrains the even tap coefficients such that C0, C2, C4, and C6 are coupled.

44. Apparatus for constraining tap coefficients in an adaptive Finite Impulse Response filter, comprising;

coefficient supply means for providing at least two even tap coefficients and at least two odd tap coefficients to the adaptive Finite Impulse Response filter, and constraint means for selectively constraining changes in the values of at least one of (i) the two even tap coefficients and (ii) the two odd tap coefficients, wherein said constraint means constrains the odd tap coefficients such that C1−C3+C5=a constant, wherein said constrain means constrains the odd tap coefficients such that C1 and C5 are coupled.

45. Apparatus for constraining tap coefficients in an adaptive Finite Impulse Response filter, comprising;

coefficient supply means for providing at least two even tap coefficients and at least two odd tap coefficients to the adaptive Finite Impulse Response filter; and constraint means for selectively constraining changes in the values of at least one of (i) the two even tap coefficients and (ii) the two odd tap coefficients, wherein said constraint means constrains the even tap coefficients but not the odd tap coefficients.

46. Apparatus for constraining tap coefficients in an adaptive Finite Impulse Response filter, comprising;

coefficient supply means for providing at least two even tap coefficients and at least two odd tap coefficients to the adaptive Finite Impulse Response filter; and constraint means for selectively constraining changes in the values of at least one of (i) the two even tap coefficients and (ii) the two odd tap coefficients, wherein said constraint means constrains the odd tap coefficients but not the even tap coefficients.

47. Apparatus for constraining adaptation coefficients in an equalizer, comprising:

sub-sampling means for outputting sub-samples of equalizer output signals;

quantizing means for outputting quantized, sub-sampled output signals; and constraining means for constraining the adaptation coefficients of the equalizer by applying a constant orthogonal projection matrix to the quantized, sub-sampled output signals.

48. Apparatus according to claim 47, wherein said constraining means constrains odd tap coefficients using said constant orthogonal projection matrix.

49. Apparatus, according to claim 48, wherein said constraining means constrains odd tap coefficients such that $C1-C3+C5=$ a constant.

50. Apparatus according to claim 48, wherein said constraining means constrains odd tap coefficients such that C1, C3, and C5 are coupled.

51. Apparatus according to claim 48, wherein said constraining means constrains odd tap coefficients such that C1 and C5 are coupled.

52. Apparatus according to claim 47, further comprising selecting means for selecting among the following odd tap constraint modes:
where C1, C3, and C5 are coupled; and
where C1 and C5 are coupled.

53. Apparatus according to claim 47, wherein said constraining means constrains even tap coefficients such that $C0-C2+C4-C6=0$.

54. Apparatus according to claim 53, wherein said constraining means constrains even tap coefficients such that C2 and C4 are coupled.

55. Apparatus according to claim 53, wherein said constraining means constrains even tap coefficients such that C2 and C4 are coupled, and such that C0 and C6 are coupled.

56. Apparatus according to claim 53, wherein said constraining means constrains even tap coefficients such that C0, C2, C4, and C6 are coupled.

57. Apparatus according to claim 47, further comprising selecting means for selecting among the following even tap constraint modes:
where C2 and C4 are coupled;
where C2 and C4 are coupled, and where C0 and C6 are coupled; and
where C0, C2, C4, and C6 are coupled.

58. Apparatus according to claim 47, further comprising selecting means for selecting among following constraint modes:
where C1, C3, and C5 are coupled;
where C1 and C5 are coupled;
where C2 and C4 are coupled;
where C2, C4 are coupled and where C0 and C6 are coupled; and
where; C0, C2, C4, and C6 are coupled.

59. Equalizer circuitry comprising:
an adaptive Finite Impulse Response filter having taps C0, C1, C2, C3, C4, C5, and C6;
coefficient supply means for providing coefficients to said taps,
wherein even tap coefficients are grouped into a plurality of groups of even tap coefficients and odd tap coefficients are grouped into a plurality of groups of odd tap coefficients; and
adaptive means for changing the coefficients supplied by said coefficient supply means in accordance with changes in an output of the Finite Impulse Response filter, said adaptive means including constraining means for constraining allowable changes in both the even tap coefficients C0, C2, C4, C6 in at least one of the plurality of groups of even tap coefficients and in the odd tap coefficients C1, C3 C5 in at least one of the plurality of groups of odd tap coefficients,
wherein a change in tap coefficients in a group of tap coefficients is independent of changes in tap coefficients in other groups of tap coefficients.

60. Circuitry according to claim 59, wherein said constraining means constrains the even tap coefficients such that $C0-C2+C4-C6=0$.

61. Apparatus according to claim 59, wherein said constraining means constrains C1, C3, and C5 by application of a constant orthogonal projection matrix.

62. Equalizer circuitry, comprising:
an adaptive Finite Impulse Response filter having taps C0, C1, C2, C3, C4, C5, and C6;
coefficient supply means for providing coefficients to said taps, and
adaptive means for changing the coefficients supplied by said coefficient supply means in accordance with changes in an output of the Finite Impulse Response filter, said adaptive means including constraining means for constraining allowable changes in both the even tap coefficients C0, C2, C4, C6 and in the odd tap coefficients C1, C3 C5,
wherein said constraining means constrains the even tap coefficients such that C2 and C4 change by substantially the same amount.

63. Circuitry according to claim 60, wherein said constraining means constrains the even coefficients such that C0 and C6 change by substantially the same amount.

64. Equalizer circuitry, comprising:
an adaptive Finite Impulse Response filter having taps C0, C1, C2, C3, C4, C5, and C6;
coefficient supply means for providing coefficients to said taps; and
adaptive means for changing the coefficients supplied by said coefficient supply means in accordance with changes in an output of the Finite Impulse Response filter, said adaptive means including constraining means for constraining allowable changes in both the even tap coefficients C0, C2, C4, C6 and in the odd tap coefficients C1, C3 C5,
wherein said constraining means constrains the odd tap coefficients such that C1 and C5 are coupled.

65. Equalizer circuitry, comprising:
an adaptive Finite Impulse Response filter having taps C0, C1, C2, C3, C4, C5, and C6;
coefficient supply means for providing coefficients to said taps; and
adaptive means for changing the coefficients supplied by said coefficient supply means in accordance with changes in an output of the Finite Impulse Response filter, said adaptive means including constraining means for constraining allowable changes in both the even tap coefficients C0, C2, C4, C6 and in the odd tap coefficients C1, C3 C5,
wherein said constraining means constrains the even tap coefficients but not the odd tap coefficients.

66. Equalizer circuitry, comprising:
an adaptive Finite Impulse Response filter having taps C0, C1, C2, C3, C4, C5, and C6;
coefficient supply means for providing coefficients to said taps; and
adaptive means for changing the coefficients supplied by said coefficient supply means in accordance with changes in an output of the Finite Impulse Response filter, said adaptive means including constraining means for constraining allowable changes in both the even tap coefficients C0, C2, C4, C6 and in the odd tap coefficients C1, C3 C5,
wherein said constraining means constrains the odd tap coefficients but not the even tap coefficients.

67. A method for constraining tap coefficients in an adaptive Finite Impulse Response filter, comprising the steps of:
supplying least two even tap coefficients and at least two odd tap coefficients to the adaptive Finite Impulse Response filters,
wherein the at least two even tap coefficients are grouped into a plurality of groups of even tap coefficients and the at least two odd tap coefficients are grouped into a plurality of groups of odd tap coefficients; and
selectively constraining changes in the values of at least one of (i) even tap coefficients in at least one of the plurality of groups of even tap coefficients and (ii) odd tap coefficients in at least one of the plurality of groups of odd tap coefficients,
wherein a change in value of tap coefficients in a group of tap coefficients is independent of changes in values of tap coefficients in other groups of tap coefficients.

68. A method according to claim 67, wherein said constraining step constrains the odd tap coefficients by orthogonal projection.

69. A method according to claim 67, wherein said constraining step constrains the even tap coefficients such that C0−C2+C4−C6=0.

70. A method according to claim 67, wherein said constraining step constrains the odd tap coefficients such that C1−C3+C5=a constant.

71. A method according to claim 67, wherein said constraining step constrains C1, C3, and C5 by application of a constant orthogonal projection matrix.

72. A method for constraining tap coefficients in an adaptive Finite Impulse Response filter, comprising the steps of:
supplying least two even tap coefficients and at least two odd tap coefficients to the adaptive Finite Impulse Response filter;
selectively constraining changes in the values of at least one of (i) the two even tap coefficients and (ii) the two odd tap coefficients,
wherein said constraining step constrains the odd tap coefficients by orthogonal projection; and
sub-sampling an adaptive Finite Impulse Response filter output signal to provide to said constraint step sub-samples of the adaptive Finite Impulse Response filter output signal.

73. A method according to claim 72, further comprising the step of quantizing the sub-samples of the adaptive Finite Impulse Response filter output signal prior to orthogonal projection.

74. A method for constraining tap coefficients in an adaptive Finite Impulse Response filter, comprising the steps of:
supplying least two even tap coefficients and at least two odd tap coefficients to the adaptive Finite Impulse Response filter; and
selectively constraining changes in the values of at least one of (i) the two even tap coefficients and (ii) the two odd tap coefficients,
wherein said constraining step constrains the even tap coefficients such that C0−C2+C4−C6=0,
wherein said constraining step constrains the even tap coefficients such that C2 and C4 are coupled.

75. A method for constraining tap coefficients in an adaptive Finite Impulse Response filter, comprising the steps of:
supplying least two even tap coefficients and at least two odd tap coefficients to the adaptive Finite Impulse Response filter; and
selectively constraining changes in the values of at least one of (i) the two even tap coefficients and (ii) the two odd tap coefficients,
wherein said constraining step constrains the even tap coefficients such that C0−C2+C4−C6=0,
wherein said constraining step constrains the even tap coefficients is such that C2 and C4 are coupled, and such that C0 and C6 are coupled.

76. A method for constraining tap coefficients in an adaptive Finite Impulse Response filter, comprising the steps of:
supplying least two even tap coefficients and at least two odd tap coefficients to the adaptive Finite Impulse Response filter; and
selectively constraining changes in the values of at least one of (i) the two even tap coefficients and (ii) the two odd tap coefficients,
wherein said constraining step constrains the even tap coefficients such that C0−C2+C4−C6=0,
wherein said constraining step constrains the even tap coefficients such that C0, C2, C4, and C6 are coupled.

77. A method for constraining tap coefficients in an adaptive Finite Impulse Response filter, comprising the steps of:
supplying least two even tap coefficients and at least two odd tap coefficients to the adaptive Finite Impulse Response filter; and
selectively constraining changes in the values of at least one of (i) the two even tap coefficients and (ii) the two odd tap coefficients,
wherein said constraining step constrains C1, C3, and C5 by application of a constant orthogonal projection matrix,
wherein said constraining step constrains the odd tap coefficients such that C1 and C5 are coupled.

78. A method for constraining tap coefficients in an adaptive Finite Impulse Response filter, comprising the steps of:
supplying least two even tap coefficients and at least two odd tap coefficients to the adaptive Finite Impulse Response filter; and
selectively constraining changes in the values of at least one of (i) the two even tap coefficients and (ii) the two odd tap coefficients,
wherein said constraining step constrains the even tap coefficients but not the odd tab coefficients.

79. A method for constraining tap coefficients in an adaptive Finite Impulse Response filter, comprising the steps of:
supplying least two even tap coefficients and at least two odd tap coefficients to the adaptive Finite Impulse Response filter; and
selectively constraining changes in the values of at least one of (i) the two even tap coefficients and (ii) the two odd tap coefficients,
wherein said constraining step constraints the odd tap coefficients but not the even tap coefficients.

80. A method for constraining adaptation coefficients in an equalizer, comprising:
a sub-sampling step for outputting sub-samples of equalizer output signals;

a quantizing step for outputting quantized, sub-sampled output signals; and a constraining step for constraining the adaptation coefficients of the equalizer by applying a constant orthogonal projection matrix to the quantized, sub-sampled output signals.

81. A method according to claim 80, wherein said constraining step constrains odd tap coefficients using said constant orthogonal projection matrix.

82. A method according to claim 80, wherein said constraining step constrains odd tap coefficients such that C1−C3+C5=a constant.

83. A method according to claim 82, wherein said constraining step constrains odd tap coefficients such that C1, C3, and C5 are coupled.

84. A method according to claim 82, wherein said constraining step constrains odd tap coefficients such that C1 and C5 are coupled.

85. A method according to claim 80, further comprising a selecting step for selecting among the following odd tap constraint modes:

where C1, C3, and C5 are coupled; and where C1 and C5 are coupled.

86. A method according to claim 80, wherein said constraining step constrains even tap coefficients such that C0−C2+C4−C6=0.

87. A method according to claim 86, wherein said constraining step constrains even tap coefficients such that C2 and C4 are coupled.

88. A method according to claim 86, wherein said constraining step constrains even tap coefficients such that C2 and C4 are coupled, and such that C0 and C6 are coupled.

89. A method according to claim 86, wherein said constraining step constrains even tap coefficients such that C0, C2, C4, and C6 are coupled.

90. A method according to claim 80, further comprising a selecting step for selecting among the following even tap constraint modes:

where C2 and C4 are coupled;

where C2 and C4 are coupled, and where C0 and C6 are coupled; and where C0, C2, C4, and C6 are coupled.

91. A method according to claim 80, further comprising a selecting step for selecting among the following constraint modes:

where C1, C3, and C5 are coupled;

where C1 and C5 are coupled;

where C2 and C4 are coupled;

where C2, C4 are coupled and where C0 and C6 are coupled; and where C0, C2, C4, and C6 are coupled.

92. A method of operating an adaptive Finite Impulse Response filter having taps C0, C1, C2, C3, C4, C5, and C6, comprising the steps of:

a coefficient supply step for supplying coefficients to the taps,
wherein even tap coefficients are grouped into a plurality of groups of even tap coefficients and odd tap coefficients are grouped into a plurality of groups of odd tap coefficients; and an adaptive step for changing the coefficients supplied by said coefficient supply step in accordance with changes in an output of the Finite Impulse Response filter, said adaptive step including a step for constraining allowable changes in both the even coefficients C0, C2, C4, C6 in at least one of the plurality of groups of even tap coefficients and in the odd coefficients C1, C3, C5 in at least one of the plurality of groups of odd tap coefficients,
wherein a change in tap coefficients in a group of tap coefficients is independent of changes in tap coefficients in other groups of tap coefficients.

93. A method according to claim 92, wherein said constraining step constrains the even tap coefficients such that C0−C2+C4−C6=0.

94. A method according to claim 92, wherein said constraining step constrains C1, C3, and C5 by application of a constant orthogonal projection matrix.

95. A method according to claim 92, wherein said constraining step constrains the odd tap coefficients such that C1 and C5 are coupled.

96. A method of operating an adaptive Finite Impulse Response filter having taps C0, C1, C2, C3, C4, C5, and C6, comprising the steps of:

a coefficient supply step for supplying, coefficients to the taps; and an adaptive step for changing the coefficients supplied by said coefficient supply step in accordance with changes in an output of the Finite Impulse Response filter, said adaptive step including a step for constraining allowable changes in both the even coefficients C0, C2, C4, C6 and in the odd coefficients C1, C3, C5,
wherein said constraining step constrains the even coefficients such that C2 and C4 change by substantially the same amount.

97. A method of operating an adaptive Finite Impulse Response filter having taps C0, C1, C2, C3, C4, C5, and C6, comprising the steps of:

a coefficient supply step for supplying coefficients to the taps; and an adaptive step for changing the coefficients supplied by said coefficient supply step in accordance with changes in an output of the Finite Impulse Response filter, said adaptive step including a step for constraining allowable changes in both the even coefficients C0, C2, C4, C6 and in the odd coefficients C1, C3, C5,
wherein said constraining step constrains the even coefficients such that C0 and C6 change by substantially the same amount.

98. A method of operating an adaptive Finite Impulse Response filter having taps C0, C1, C2, C3, C4, C5, and C6, comprising the steps of:

a coefficient supply step for supplying coefficients to the taps; and an adaptive step for chanting the coefficients supplied by said coefficient supply step in accordance with changes in an output of the Finite Impulse Response filter, said adaptive step including a step for constraining allowable changes in both the even coefficients C0, C2, C4, C6 and in the odd coefficients C1, C3, C5,
wherein said constraining step constrains the even tap coefficients but not the odd tap coefficients.

99. A method of operating an adaptive Finite Impulse Response filter having taps C0, C1, C2, C3, C4, C5, and C6, comprising the steps of:

a coefficient supply step for supplying coefficients to the taps; and an adaptive step for changing the coefficients supplied by said coefficient supply step in accordance with changes in an output of the Finite Impulse Response filter, said adaptive step including a step for constraining allowable changes in both the even coefficients C0, C2, C4, C6 and in the odd coefficients C1, C3, C5,
wherein said constraining step constrains the odd tap coefficients but not the even tap coefficients.

100. A digital data read channel, comprising:
analog input circuitry receiving an analog input signal, the analog input circuitry including an analog-to-digital converter;
gain control circuitry disposed to control a gain of said analog input circuitry,
timing control circuitry disposed to control a timing of said analog-to-digital converter;
equalizer circuitry coupled to said analog-to-digital converter and including:
an adaptive Finite Impulse Response filter having taps C0, C1, C2, C3, C4, C5, and C6;
a coefficient supplier coupled to provide coefficients to said taps,
wherein even tap coefficients are grouped into a plurality of groups of even tap coefficients and odd tap coefficients are grouped into a plurality of groups of odd tap coefficients; and
adaptive circuitry coupled to change the coefficients s supplied by said coefficient supplier in accordance with changes in an output of the Finite Impulse Response filter, said adaptive circuitry including circuitry coupled to constrain allowable changes in both the even coefficients C0, C2, C4, C6 in at least one of the plurality of groups of even tap coefficients and in the odd coefficients C1, C3, C5 in at least one of the plurality of groups of odd tap coefficients,
wherein a change in tap coefficients in a group of tap coefficients is independent of changes in tap coefficients in other groups of tap coefficients; and
a decoder coupled to an output of said equalizer circuitry.

101. A digital data read channel according to claim 100, wherein said adaptive circuitry constrains the even tap coefficients such that C0−C2+C4−C6=0.

102. A digital data read channel according to claim 100, wherein said adaptive circuitry constrains C1, C3, and C5 by application of a constant orthogonal projection matrix.

103. A digital data read channel, comprising:
analog input circuitry receiving an analog input signal, the analog input circuitry including an analog-to-digital converter;
gain control circuitry disposed to control a gain of said analog input circuitry,
timing control circuitry disposed to control a timing of said analog-to-digital converter;
equalizer circuitry coupled to said analog-to-digital converter and including:
an adaptive Finite Impulse Response filter having taps C0, C1, C2, C3, C4, C5, and C6,
a coefficient supplier coupled to provide coefficients to said taps; and
adaptive circuitry coupled to change the coefficients s supplied by said coefficient supplier in accordance with changes in an output of the Finite Impulse Response filter, said adaptive circuitry including circuitry coupled to constrain allowable changes in both the even coefficients C0, C2, C4, C6 and in the odd coefficients C1, C3, C5,
wherein said adaptive circuitry constrains the even coefficients such that C2 and C4 change by substantially the same amount; and
a decoder coupled to an output of said equalizer circuitry.

104. A digital data read channel according to claim 103, wherein said adaptive circuitry constrains the even coefficients such that C0 and C5 change by substantially the same amount.

105. A digital data read channel, comprising:
analog input circuitry receiving an analog input signal, the analog input circuitry including an analog-to-digital converter;
gain control circuitry disposed to control a gain of said analog input circuitry,
timing control circuitry disposed to control a timing of said analog-to-digital converter;
equalizer circuitry coupled to said analog-to-digital converter and including:
an adaptive Finite Impulse Response filter having taps C0, C1, C2, C3, C4, C5, and C6;
a coefficient supplier coupled to provide coefficients to said taps; and
adaptive circuitry coupled to change the coefficients s supplied by said coefficient supplier in accordance with changes in an output of the Finite Impulse Response filter, said adaptive circuitry including circuitry coupled to constrain allowable changes in both the even coefficients C0, C2, C4, C6 and in the odd coefficients C1, C3, C5,
wherein said adaptive circuitry constrains C1, C3, and C5 by application of a constant orthogonal projection matrix,
wherein said adaptive circuitry constrains the odd tap coefficients such that C1 and C5 are coupled; and
a decoder coupled to an output of said equalizer circuitry.

106. A digital data read channel, comprising:
analog input circuitry receiving an analog input signal, the analog input circuitry including an analog-to-digital converter;
gain control circuitry disposed to control a gain of said analog input circuitry,
timing control circuitry disposed to control a timing of said analog-to-digital converter;
equalizer circuitry coupled to said analog-to-digital converter and including:
an adaptive Finite Impulse Response filter having taps C0, C1, C2, C3, C4, C5, and C6,
a coefficient supplier coupled to provide coefficients to said taps, and
adaptive circuitry coupled to change the coefficients s supplied by said coefficient supplier in accordance with changes in an output of the Finite Impulse Response filter, said adaptive circuitry including circuitry coupled to constrain allowable changes in both the even coefficients C0, C2, C4, C6 and in the odd coefficients C1, C3, C5,
wherein said adaptive circuitry constrains the even tap coefficients but not the odd tap coefficients; and
a decoder coupled to an output of said equalizer circuitry.

107. A digital data read channel, comprising:
analog input circuitry receiving an analog input signal, the analog input circuitry including an analog-to-digital converter;
gain control circuitry disposed to control a gain of said analog input circuitry,
timing control circuitry disposed to control a timing of said analog-to-digital converter;
equalizer circuitry coupled to said analog-to-digital converter and including:

an adaptive Finite Impulse Response filter having taps C0, C1, C2, C3, C4, C5, and C6;

a coefficient supplier coupled to provide coefficients to said taps; and adaptive circuitry coupled to change the coefficients s supplied by said coefficient supplier in accordance with changes in an output of the Finite Impulse Response filter, said adaptive circuitry including circuitry coupled to constrain allowable changes in both the even coefficients C0, C2, C4, C6 and in the odd coefficients C1, C3, C5, wherein said adaptive circuitry constrains the odd tap coefficients but not the even tap coefficients; and a decoder coupled to an output of said equalizer circuitry.

108. A digital data read channel, comprising:

analog input circuitry receiving an analog input signal, the analog input circuitry including as analog-to-digital converter;

gain control circuitry disposed to control a gain of said analog input circuitry;

timing control circuitry disposed to control a timing of said analog-to-digital converter;

equalizer circuitry coupled to said analog-to-digital converter and including:

an adaptive Finite Impulse Response filter having taps C0; C1, C2, C3, C4, C5, and C6;

coefficient supply means for providing coefficients to said taps, wherein even tap coefficients are grouped into a plurality of groups of even tap coefficients and odd tap coefficients are grouped into a plurality of groups of odd tap coefficients; and adaptive means for changing the coefficients supplied by said coefficient supply means in accordance with changes in an output of the Finite Impulse Responses filter, said adaptive means including constraining means for constraining allowable changes in both the even coefficients C0, C2, C4, C6 in at least one of the plurality of groups of even tap coefficients and in the odd coefficients C1, C3, C5 in at least one of the plurality of groups of odd tap coefficients, wherein a change in tap coefficients in a group of tap coefficients is independent of changes in tap coefficients in other groups of tap coefficients; and a decoder coupled to an output of said equalizer circuitry.

109. A digital data read chancel according to claim 108, wherein said constraining means constrains the even tap coefficients such that C0−C2+C4−C6=0.

110. A digital data read channel according to claim 108, wherein said constraining means constrains C1, C3, and C5 by application of a constant orthogonal projection matrix.

111. A digital data read channel, comprising:

analog input circuitry receiving an analog input signal, the analog input circuitry including as analog-to-digital converter;

gain control circuitry disposed to control a gain of said analog input circuitry.

timing control circuitry disposed to control a timing of said analog-to-digital converter;

equalizer circuitry coupled to said analog-to-digital converter and including:

an adaptive Finite Impulse Response filter having taps C0; C1, C2, C3, C4, C5, and C6;

coefficient supply means for providing coefficients to said taps; and adaptive means for changing the coefficients supplied by said coefficient supply means in accordance with changes in an output of the Finite Impulse Responses filter, said adaptive means including constraining means for constraining allowable changes in both the even coefficients C0, C2, C4, C6 and in the odd coefficients C1, C3, C5, wherein said constraining means constrains the even tap coefficients such that C2 and C4 change by substantially the same amount; and a decoder coupled to an output of said equalizer circuitry.

112. A digital data read channel according to claim 111, wherein said constraining means constrains the even coefficients such that C0 and C6 change by substantially the same amount.

113. A digital data read channel, comprising:

analog input circuitry receiving an analog input signal, the analog input circuitry including as analog-to-digital converter;

gain control circuitry disposed to control a gain of said analog input circuitry timing control circuitry disposed to control a timing of said analog-to-digital converter;

equalizer circuitry coupled to said analog-to-digital converter and including:

an adaptive Finite Impulse Response filter having taps C0; C1, C2, C3, C4, C5, and C6;

coefficient supply means for providing coefficients to said taps; and adaptive means for changing the coefficients supplied by said coefficient supply means in accordance with changes in an output of the Finite Impulse Responses filter, said adaptive means including constraining means for constraining allowable changes in both the even coefficients C0, C2, C4, C6 and in the odd coefficients C1, C3, C5 wherein said constraining means constrains C1, C3, and C5 by application of a constant orthogonal projection matrix, wherein said constraining means constrains the odd tap coefficients such that C1 and C5 are coupled; and a decoder coupled to an output of said equalizer circuitry.

114. A digital data read channel, comprising:

analog input circuitry receiving an analog input signal, the analog input circuitry including as analog-to-digital converter;

gain control circuitry disposed to control a gain of said analog input circuitry timing control circuitry disposed to control a timing of said analog-to-digital converter, equalizer circuitry coupled to said analog-to-digital converter and including:

an adaptive Finite Impulse Response filter having taps C0; C1, C2, C3, C4, C5, and C6;

coefficient supply means for providing coefficients to said taps; and adaptive means for changing the coefficients supplied by said coefficient supply means in accordance with changes in an output of the Finite Impulse Responses filter, said adaptive means including constraining means for constraining allowable changes in both the even coefficients C0, C2, C4, C6 and in the odd coefficients C1, C3, C5, wherein said constraining means constrains the even tap coefficients but not the odd tap coefficients; and a decoder coupled to an output of said equalizer circuitry.

115. A digital data read channel, comprising:
- analog input circuitry receiving an analog input signal, the analog input circuitry including as analog-to-digital converter;
- gain control circuitry disposed to control a rain of said analog input circuitry
- timing control circuitry disposed to control a timing of said analog-to-digital converter;
- equalizer circuitry coupled to said analog-to-digital converter and including:
  - an adaptive Finite Impulse Response filter having taps C0; C1, C2, C3, C4, C5, and C6;
  - coefficient supply means for providing coefficients to said taps; and
  - adaptive means for changing the coefficients supplied by said coefficient supply means in accordance with changes in an output of the Finite Impulse Responses filter, said adaptive means including constraining means for constraining allowable changes in both the even coefficients C0, C2, C4, C6 and in the odd coefficients C1, C3, C5,
    - wherein said constraining means constrains the odd tap coefficients but not the even tap coefficients; and
- a decoder coupled to an output of said equalizer circuitry.

116. A computer readable storage medium storing code which causes a processor to constrain tap coefficients in an adaptive filter, the code causing the processor to perform the steps of:
- supplying least two even tap coefficients and at least two odd tap coefficients to the adaptive filter,
  - wherein the at least two even tap coefficients are grouped into a plurality of groups of even tap coefficients and the at least two odd tap coefficients are grouped into a plurality of groups of odd tap coefficients; and
- selectively constraining changes in the values of at least one of (i) even tap coefficients in at least one of the plurality of groups of even tap coefficients and (ii) odd tap coefficients in at least one of the plurality of groups of odd tap coefficients,
  - wherein a change in value of tap coefficients in a group of tap coefficients is independent of changes in values of tap coefficients in other groups of tap coefficients.

117. A computer readable storage medium according to claim 116, wherein the code causes said constraining step to constrain the odd tap coefficients by orthogonal projection.

118. A computer readable storage medium according to claim 116, wherein the code causes said constraining step to constrain the even tap coefficients such that C0−C2+C4−C6=0.

119. A computer readable storage medium according to claim 116, wherein the code causes said constraining step to constrain the odd tap coefficients such that C1−C3+C5=a constant.

120. A computer readable storage medium according to claim 119, wherein the code causes said constraining step to constrain C1, C3, and C5 by application of a constant orthogonal projection matrix.

121. A computer readable storage medium storing code which causes a processor to constrain tap coefficients in an adaptive filter, the code causing the processor to perform the steps of:
- supplying least two even tap coefficients and at least two odd tap coefficients to the adaptive filter; and
- selectively constraining changes in the values of at least one of (i) the two even tap coefficients and (ii) the two odd tap coefficients; and
- sub-sampling an adaptive filter output signal to provide to said constraint step sub-samples of the adaptive filter output signal.

122. A computer readable storage medium according to claim 121, wherein the code causes the further step of quantizing the sub-samples of the adaptive filter output signal prior to orthogonal projection.

123. A computer readable storage medium storing code which causes a processor to constrain tap coefficients in an adaptive filter, the code causing the processor to perform the steps of:
- supplying least two even tap coefficients and at least two odd tap coefficients to the adaptive filter; and
- selectively constraining changes in the values of at least one of (i) the two even tap coefficients and (ii) the two odd tap coefficients,
  - wherein the code causes said constraining step to constrain the even tap coefficients such that C0−C2+C4−C6=0,
  - wherein the code causes said constraining step to constrain the even tap coefficients such that C2 and C4 are coupled.

124. A computer readable storage medium storing code which causes a processor to constrain tap coefficients in an adaptive filter, the code causing the processor to perform the steps of:
- supplying least two even tap coefficients and at least two odd tap coefficients to the adaptive filter; and
- selectively constraining changes in the values of at least one of (i) the two even tap coefficients and (ii) the two odd tap coefficients,
  - wherein the code causes said constraining step to constrain the even tap coefficients such that C0−C2+C4−C6=0,
  - wherein the code causes said constraining step to constrain the even tap coefficients such that C2 and C4 are coupled, and such that C0 and C6 are coupled.

125. A computer readable storage medium storing code which causes a processor to constrain tap coefficients in an adaptive filter, the code causing the processor to perform the steps of:
- supplying least two even tap coefficients and at least two odd tap coefficients to the adaptive filter; and
- selectively constraining changes in the values of at least one of (i) the two even tap coefficients and (ii) the two odd tap coefficients,
  - wherein the code causes said constraining step to constrain the even tap coefficients such that C0−C2+C4−C6=0,
  - wherein the code causes said constraining step to constrain the even tap coefficients such that C0, C2, C4, and C6 are coupled.

126. A computer readable storage medium storing code which causes a processor to constrain tap coefficients in an adaptive filter, the code causing the processor to perform the steps of:
- supplying least two even tap coefficients and at least two odd tap coefficients to the adaptive filter; and
- selectively constraining changes in the values of at least one of (i) the two even tap coefficients and (ii) the two odd tap coefficients,
  - wherein the code causes said constraining step to constrain the odd tap coefficients such that C1−C3+C5=a constant, wherein the code causes said constraining step to constrain the odd tap coefficients such that C1 and C5 are coupled.

127. A computer readable storage medium storing code which causes a processor to constrain tap coefficients in an adaptive filter, the code causing the processor to perform the steps of:

supplying least two even tap coefficients and at least two odd tap coefficients to the adaptive filter; and selectively constraining changes in the values of at least one of (i) the two even tap coefficients and (ii) the two odd tap coefficients,
wherein the code causes said constraining step to constrain the even tap coefficients but not the odd tap coefficients.

128. A computer readable storage medium storing code which causes a processor to constrain tap coefficients in an adaptive filter, the code causing the processor to perform the steps of:

supplying least two even tap coefficients and at least two odd tap coefficients to the adaptive filter; and selectively constraining changes in the values of at least one of (i) the two even tap coefficients and (ii) the two odd tap coefficients,
wherein the code causes said constraining step to constrain the odd tap coefficients but not the even tap coefficients.

129. A computer readable storage medium storing code which causes a processor to constrain adaptation coefficients in an equalizer, the code causing the processor to perform the steps of:

a sub-sampling step for outputting sub-samples of equalizer output signals;

a quantizing step for outputting quantized, sub-sampled output signals; and a constraining step for constraining the adaptation coefficients of the equalizer by applying a constant orthogonal projection matrix to the quantized, sub-sampled output signals.

130. A computer readable storage medium according to claim 129, wherein the code causes said constraining step to constrain odd tap coefficients using said constant orthogonal projection matrix.

131. A computer readable storage medium according to claim 129, wherein the code causes said constraining step to constrain odd tap coefficients such that C1−C3+C5=a constant.

132. A computer readable storage medium according to claim 131, wherein the code causes said constraining step to constrain odd tap coefficients such that C1, C3, and C5 are coupled.

133. A computer readable storage medium according to claim 131, wherein the code causes said constraining step to constrain odd tap coefficients such that C1 and C5 are coupled.

134. A computer readable storage medium according to claim 129, the code further comprises a selecting step for selecting among the following odd tap constraint modes:

where C1, C3, and C5 are coupled; and where C1 and C5 are coupled.

135. A computer readable storage medium according to claim 129, wherein the code causes said constraining step to constrain even tap coefficients such that C0−C2+C4−C6=0.

136. A computer readable storage medium according to claim 135, wherein the code causes said constraining step to constrain even tap coefficients such that C2 and C4 are coupled.

137. A computer readable storage medium according to claim 135, wherein the code causes said constraining step to constrain even tap coefficients such that C2 and C4 are coupled, and such that C0 and C6 are coupled.

138. A computer readable storage medium according to claim 135, wherein the code causes said constraining step to constrain even tap coefficients such that C0, C2, C4, and C6 are coupled.

139. A computer readable storage medium according to claim 129, wherein the code further comprises a selecting step for selecting among the following even tap constraint modes:

where C2 and C4 are coupled;

where C2 and C4 are coupled, and where C0 and C6 are coupled, and where C0, C2, C4, and C6 are coupled.

140. A computer readable storage medium according to claim, 129, wherein the code further comprises a selecting step for selecting among the following constraint modes:

where C1, C3, and C5 are coupled;

where C1 and C5 are coupled;

where C2 and C4 are coupled;

where C2, C4 are coupled and where C0 and C6 are coupled; and where C0, C2, C4, and C6 are coupled.

* * * * *

UNITED STATES PATENT AND TRADEMARK OFFICE
CERTIFICATE OF CORRECTION

PATENT NO. : 6,804,695 B1 Page 1 of 1
APPLICATION NO. : 09/717240
DATED : October 12, 2004
INVENTOR(S) : Yungping Hsu It is certified that error appears in the above-identified patent and that said Letters Patent is hereby corrected as shown below:

Col. 13, claim 6, line 41, between "of" and "the" please insert --(i)--

Signed and Sealed this

Eighteenth Day of July, 2006

JON W. DUDAS
*Director of the United States Patent and Trademark Office*